(12) United States Patent
Buijsman et al.

(10) Patent No.: US 11,664,567 B2
(45) Date of Patent: May 30, 2023

(54) HOLLOW WAVEGUIDE ASSEMBLY FORMED BY AFFIXING FIRST AND SECOND SUBSTRATES TO FORM A CAVITY THEREIN AND HAVING A CONDUCTIVE LAYER COVERING THE CAVITY

(71) Applicant: NXP B.V., Eindhoven (NL)

(72) Inventors: Adrianus Buijsman, Nijmegen (NL); Abdellatif Zanati, Hamburg (DE); Giorgio Carluccio, Eindhoven (NL)

(73) Assignee: NXP B.V., Eindhoven (NL)

( * ) Notice: Subject to any disclaimer, the term of this patent is extended or adjusted under 35 U.S.C. 154(b) by 46 days.

(21) Appl. No.: 17/106,269

(22) Filed: Nov. 30, 2020

(65) Prior Publication Data
US 2022/0173490 A1    Jun. 2, 2022

(51) Int. Cl.
| | |
|---|---|
| *H01P 3/12* | (2006.01) |
| *H01P 11/00* | (2006.01) |
| *H01L 23/66* | (2006.01) |
| *H01P 5/107* | (2006.01) |
| *H01Q 1/32* | (2006.01) |

(Continued)

(52) U.S. Cl.
CPC ............... *H01P 3/12* (2013.01); *H01L 23/66* (2013.01); *H01P 3/121* (2013.01); *H01P 5/107* (2013.01); *H01P 11/002* (2013.01); *H01Q 1/3233* (2013.01); *H01Q 1/38* (2013.01); *H05K 3/4697* (2013.01); *H01L 2223/6627* (2013.01); *H05K 2201/037* (2013.01); *H05K 2201/09009* (2013.01)

(58) Field of Classification Search
CPC .. H01P 3/12; H01P 3/121; H01P 5/103; H01P 5/107; H01P 11/002
USPC ................................................... 333/248, 26
See application file for complete search history.

(56) References Cited

U.S. PATENT DOCUMENTS

| | | | |
|---|---|---|---|
| 7,480,435 B2 * | 1/2009 | Brist et al. ............. | H01P 3/121 385/129 |
| 9,583,811 B2 * | 2/2017 | Seler ..................... | H01P 11/003 |

(Continued)

FOREIGN PATENT DOCUMENTS

| | | |
|---|---|---|
| EP | 3339243 A1 | 6/2018 |
| JP | 2012004700 A | 1/2012 |
| WO | 2019170230 A1 | 9/2019 |

OTHER PUBLICATIONS

Karlsson, H., "Design of Gap Waveguide Antenna System for 77 GHz Automotive Radar", A Study in the Implementing of Gap Waveguide Technology in Automotive Radars, Master's Thesis in Wireless, Photonics and Space Engineering; Jun. 2018.

*Primary Examiner* — Benny T Lee

(57) ABSTRACT

A method of manufacturing a device is provided. The method includes forming a first cavity in a first substrate with the first cavity having a first depth. A second cavity is formed in a second substrate with the second cavity having a second depth. The first cavity and the second cavity are aligned with each other. The first substrate is affixed to the second substrate to form a waveguide substrate having a hollow waveguide with a first dimension substantially equal to the first depth plus the second depth. A conductive layer is formed on the sidewalls of the hollow waveguide. The waveguide substrate is placed over a packaged semiconductor device, the hollow waveguide aligned with a launcher of the packaged semiconductor device.

20 Claims, 22 Drawing Sheets

(51) Int. Cl.
*H01Q 1/38* (2006.01)
*H05K 3/46* (2006.01)

(56) References Cited

U.S. PATENT DOCUMENTS

| | | | |
|---|---|---|---|
| 10,109,604 B2* | 10/2018 | Topak | H01L 25/0655 |
| 2007/0274656 A1 | 11/2007 | Brist et al. | |
| 2012/0256796 A1 | 10/2012 | Leiba | |
| 2016/0353566 A1 | 12/2016 | Langer et al. | |
| 2018/0063965 A1 | 3/2018 | Leitgeb et al. | |
| 2018/0151935 A1* | 5/2018 | Chang et al. | C09J 5/04 |
| 2018/0183127 A1* | 6/2018 | Huang et al. | H01P 3/121 |
| 2019/0109362 A1* | 4/2019 | Haroun et al. | H01P 11/001 |
| 2020/0014100 A1 | 1/2020 | Chen et al. | |
| 2020/0365535 A1* | 11/2020 | de Graauw et al. | G01S 7/032 |

* cited by examiner

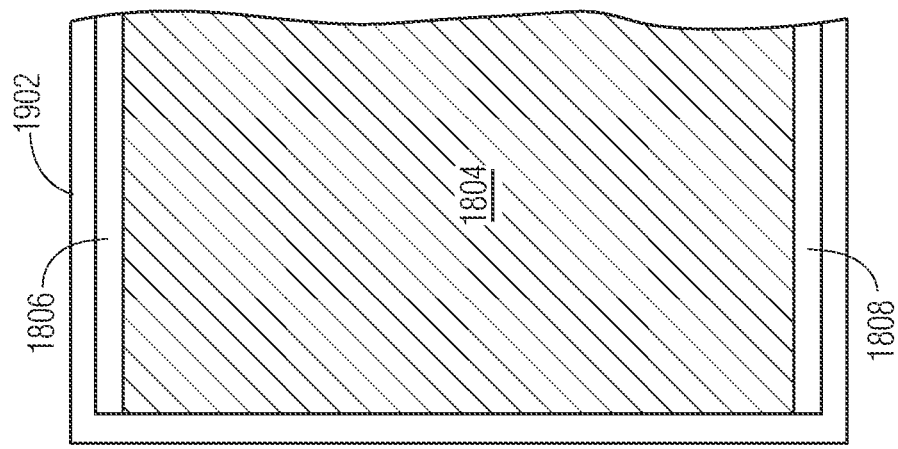
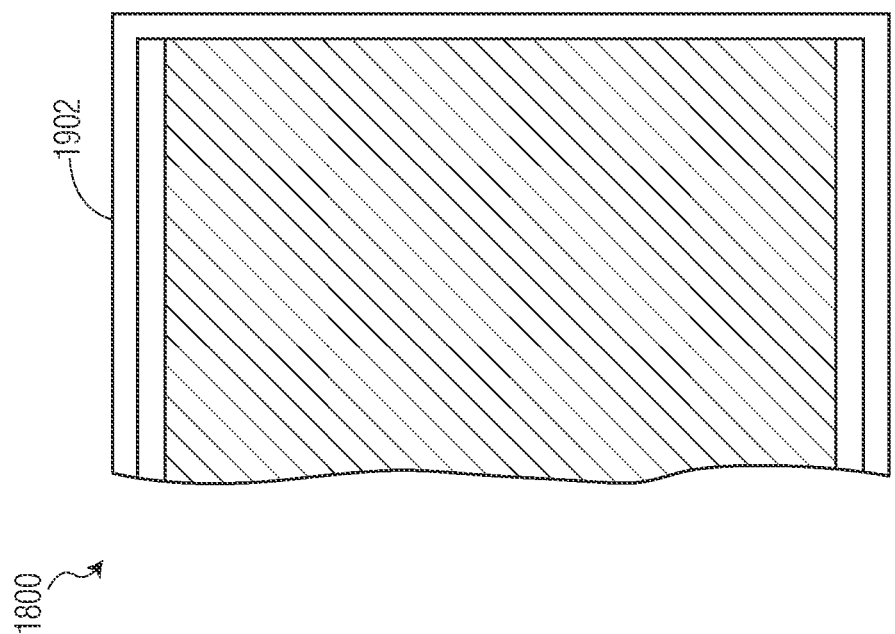
FIG. 19

US 11,664,567 B2

HOLLOW WAVEGUIDE ASSEMBLY FORMED BY AFFIXING FIRST AND SECOND SUBSTRATES TO FORM A CAVITY THEREIN AND HAVING A CONDUCTIVE LAYER COVERING THE CAVITY

BACKGROUND

Field

This disclosure relates generally to semiconductor device packaging, and more specifically, to a semiconductor device with substrate integrated hollow waveguide and method of forming the same.

Related Art

Today, there is an increasing trend to include radar systems in vehicles, for example, such as automobiles, trucks, buses, and the like in order to provide a driver with enhanced awareness of objects around the driver's vehicle. As the vehicle approaches objects (e.g. other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can significantly impact the cost of the vehicle.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 18 through FIG. 21 illustrate, in simplified cross-sectional views, yet another alternative example substrate integrated hollow waveguide along line A-A of FIG. 1A at stages of manufacture in accordance with an embodiment.

DETAILED DESCRIPTION OF THE INVENTION

Generally, there is provided, a low cost assembly including a semiconductor device with a substrate integrated waveguide. The substrate integrated waveguide includes a hollow waveguide channel formed in a waveguide substrate. The waveguide substrate is formed from a multilayer printed circuit board material. A first portion of the waveguide channel may be formed in a first waveguide substrate and a second portion of the waveguide channel may be formed in a second waveguide substrate such that the waveguide channel is formed when the first and second waveguide substrates are joined together. In this manner, a low cost waveguide can provide a channel configured for propagation of radar and mmWave signals between the semiconductor device and a waveguide antenna, for example.

Figure 1A:
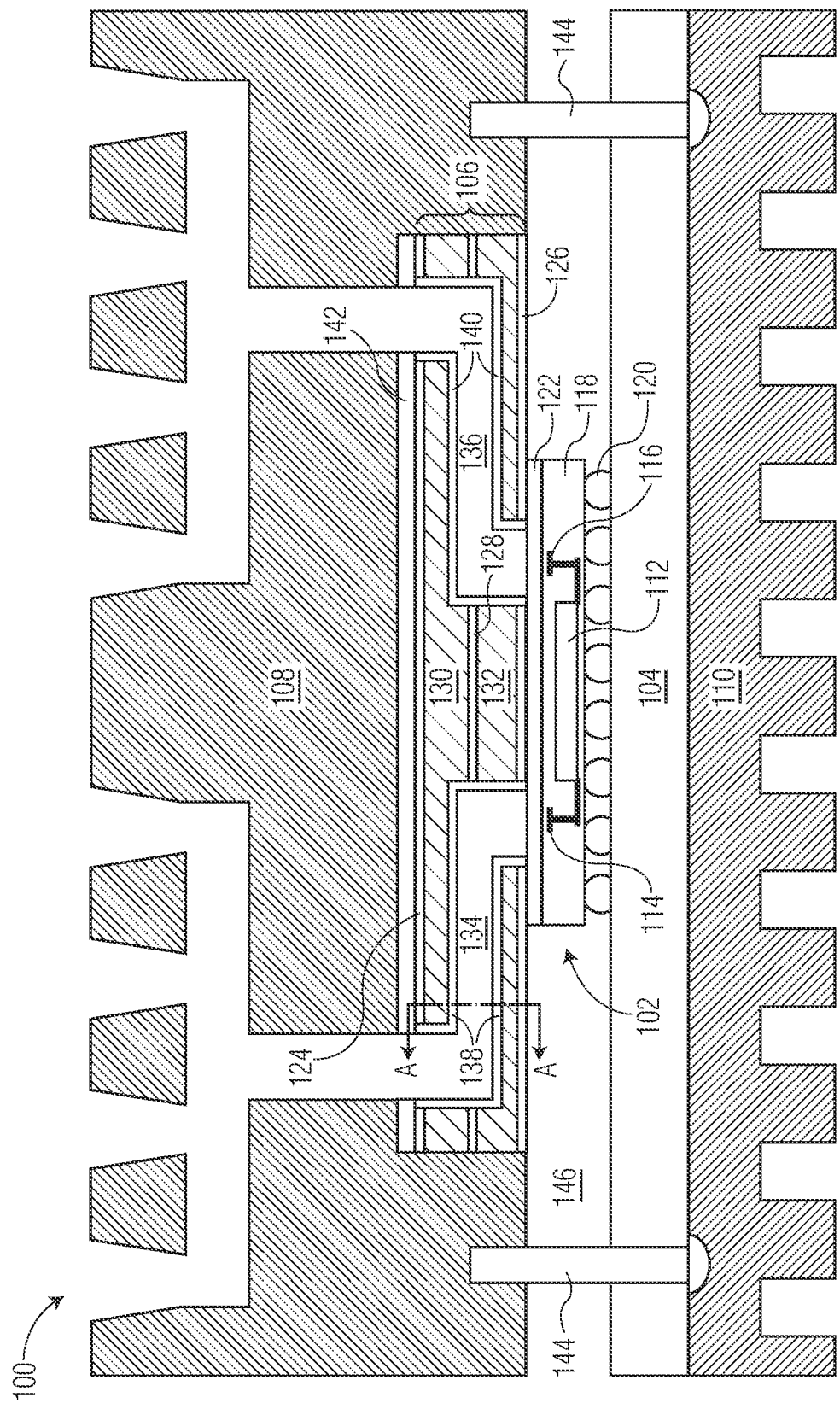
FIG. 1A and FIG. 1B illustrate, in a simplified cross-sectional view, an example assembly including a semiconductor device with substrate integrated hollow waveguide in accordance with an embodiment.
Figure 1B:
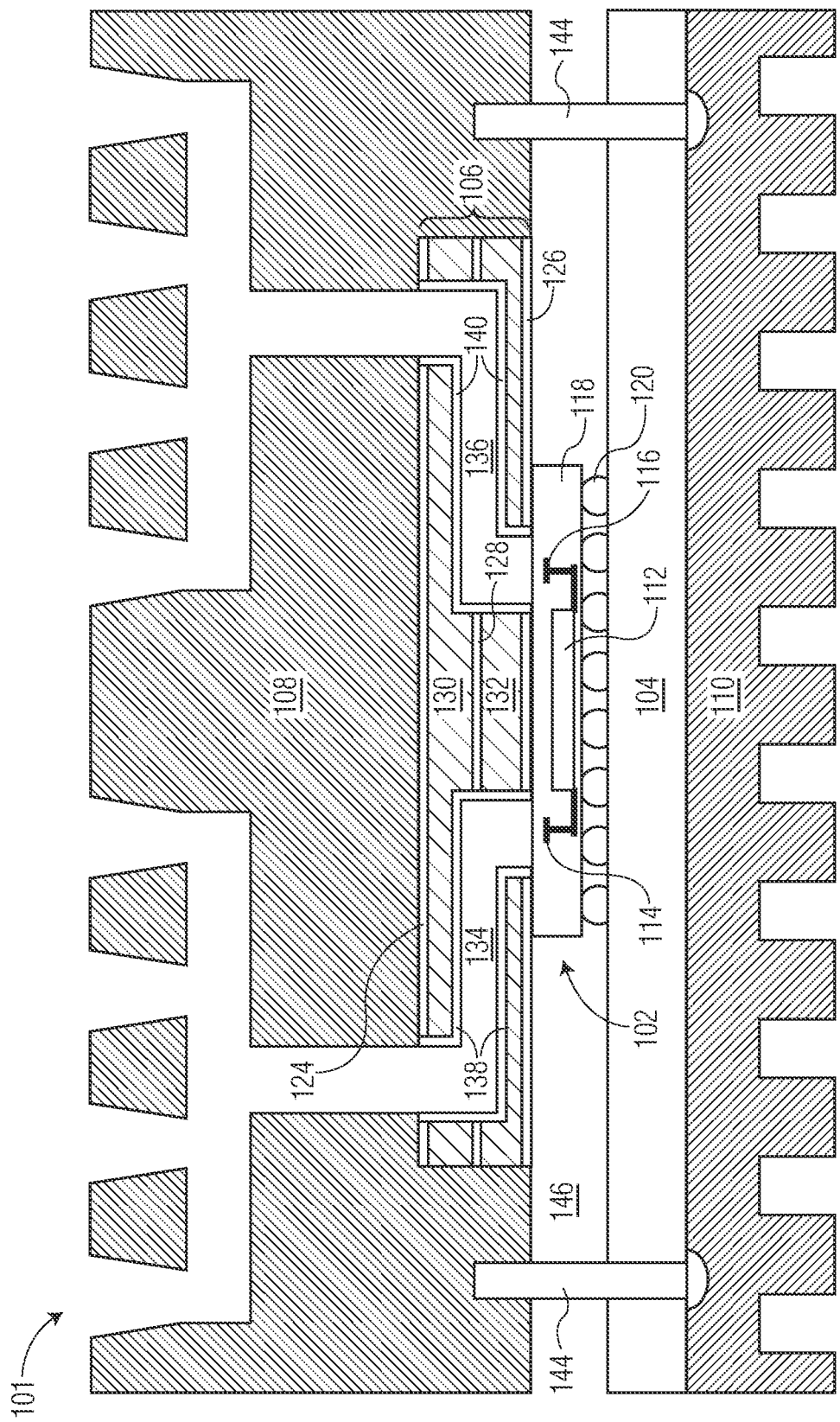

FIG. 1A and FIG. 1B illustrate, in simplified cross-sectional views, example assemblies 100 in FIG. 1A and 101 in FIG. 1B including a packaged semiconductor device 102 with substrate integrated hollow waveguide 106 in accordance with embodiments. Even though the embodiments depicted in FIG. 1A and FIG. 1B are configured in an upward radiating orientation, embodiments configured in downward radiating orientation (not shown) are anticipated by this disclosure. Cross-sectional views of examples of the substrate integrated waveguide taken along line A-A of FIG. 1A at stages of manufacture are depicted in FIG. 2 through FIG. 21.

The assembly 100 depicted in FIG. 1A includes the semiconductor device 102 affixed to a printed circuit board (PCB) 104 with the substrate integrated hollow waveguide 106 placed over the semiconductor device 102. A first dielectric or conductive interface layer 122 is disposed between a top surface of the semiconductor device 102 and bottom surface of the substrate integrated waveguide 106. A waveguide antenna structure 108 is placed over the substrate integrated waveguide 106 and attached to the PCB by way of fasteners (e.g., screws, bolts, pins, clamps) 144. The waveguide antenna structure 108 may be formed from any suitable materials and configurations. In some embodiments, the waveguide antenna structure 108 may be formed from stacked multilayer laminate PCB materials, for example. A second dielectric interface layer 142 is disposed between a top surface of the substrate integrated waveguide 106 and a bottom surface of the waveguide antenna structure 108. A heatsink structure 110 is attached to an opposite surface of the PCB and located directly below the semiconductor device 102. In some embodiments, an air-gap region 146 between the PCB 104 and the overlying portions of the substrate integrated waveguide 106 and waveguide antenna structure 108 may be filled with an epoxy molding compound, for example.

The assembly 101 depicted in FIG. 1B includes the semiconductor device 102 affixed to the PCB 104 with the substrate integrated hollow waveguide 106 placed over the semiconductor device 102. In one embodiment, an air gap may exist between the top surface of the semiconductor device 102 and the bottom surface of the substrate integrated waveguide 106. In another embodiment, the top surface of the semiconductor device 102 may be in direct contact with the bottom surface of the substrate integrated waveguide 106. The waveguide antenna structure 108 is placed over the substrate integrated waveguide 106 and attached to the PCB by way of fasteners 144. In one embodiment, an air gap may exist between the top surface of the substrate integrated waveguide 106 and the bottom surface of the waveguide antenna structure 108. In another embodiment, the top surface of the substrate integrated waveguide 106 may be in direct contact with the bottom surface of the waveguide antenna structure 108. The heatsink structure 110 is attached to the opposite surface of the PCB and located directly below the semiconductor device 102. In some embodiments, the air-gap region 146 between the PCB 104 and the overlying portions of the substrate integrated waveguide 106 and waveguide antenna structure 108 may be filled with an epoxy molding compound, for example.

The semiconductor device 102 includes a semiconductor die 112 and antenna launchers 114 and 116 encapsulated in an encapsulant 118. Detailed structures within the semiconductor device 102 such as interconnect, bond pads, connector pads, and the like are not shown for illustration purposes. In this embodiment, the semiconductor die 112 is configured to receive and/or transmit radio frequency (RF) signals (e.g., mmWave signals in a frequency range of 30 GHz to 300 GHz) by way of the launchers 114 and 116 located proximate to a top surface of the semiconductor device 102. Conductive ball connectors (e.g., solder balls) 120 are affixed at a bottom surface of the semiconductor device 102 and form conductive connections between the semiconductor device 102 and the PCB 104, for example. Ball connectors 120 may be in the form of suitable conductive structures such as solder ball, gold studs, copper pillars, and the like.

The substrate integrated hollow waveguide 106 includes waveguides 134 and 136. In this embodiment, the substrate integrated waveguide 106 is formed from two waveguide substrates joined together. A first waveguide substrate (e.g., top substrate) includes a non-conductive portion 130 and conductive layers 124 and 128 formed at respective top and bottom surfaces. A second waveguide substrate (e.g., bottom substrate) includes a non-conductive portion 132 and conductive layers 128 and 126 formed at respective top and bottom surfaces. Cavities are formed in each of the two waveguide substrates such that when joined together form waveguide channels 134 and 136. The term "waveguide channel," as used herein, may be used interchangeably with the term "waveguide." Conductive layers (e.g., copper) 138 and 140 are formed on sidewalls (e.g., inner surfaces) of respective waveguides 134 and 136.

FIG. 2 through FIG. 7 illustrate, in simplified cross-sectional views, an example substrate integrated hollow waveguide 200 taken along line A-A of FIG. 1A at stages of manufacture in accordance with an embodiment.

Figure 2:
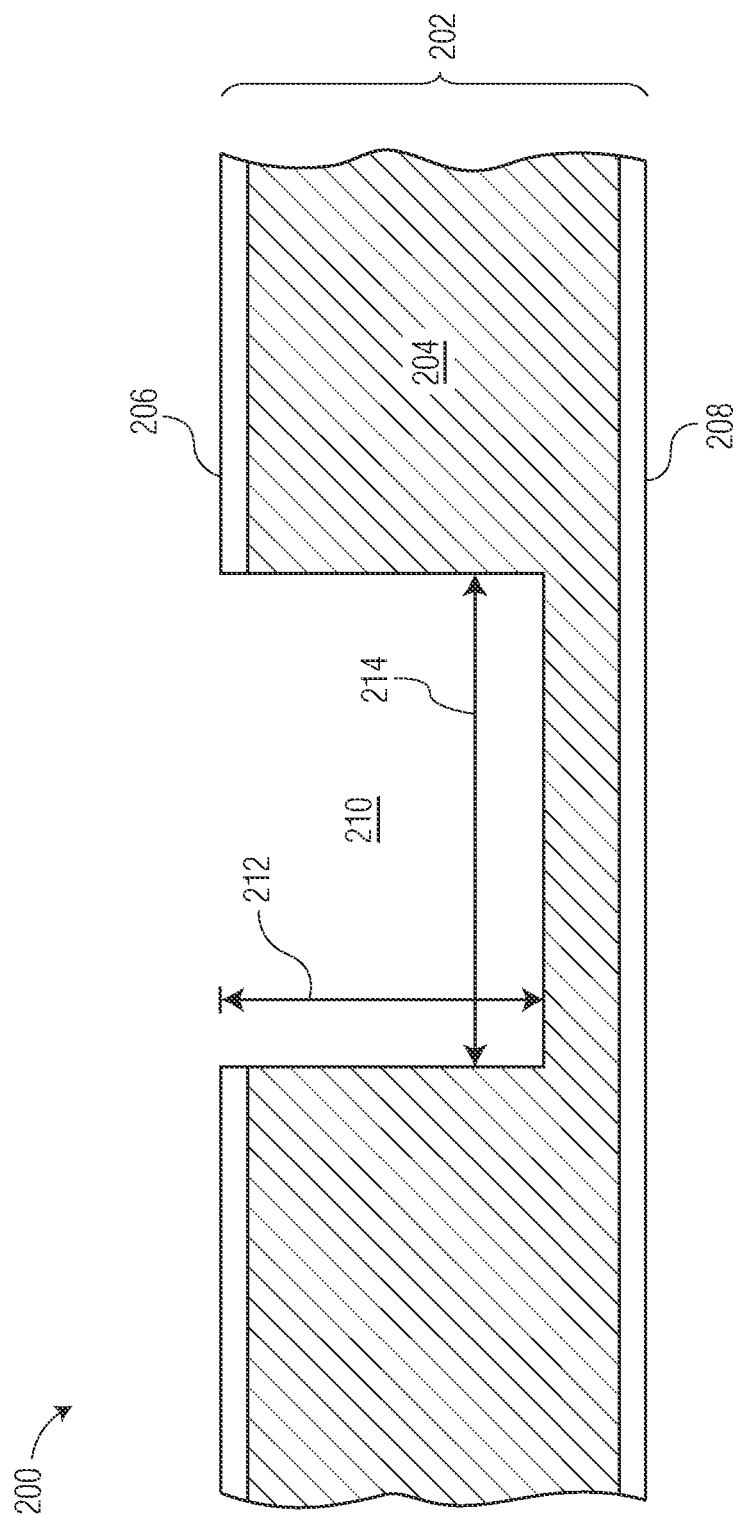
FIG. 2 through FIG. 7 illustrate, in simplified cross-sectional views, an example substrate integrated hollow waveguide along line A-A of FIG. 1A at stages of manufacture in accordance with an embodiment.

FIG. 2 illustrates the example substrate integrated waveguide 200 along line A-A of FIG. 1A at a stage of manufacture in accordance with an embodiment. At this stage of manufacture, the substrate integrated waveguide 200 includes a cavity 210 formed in a multilayer laminate waveguide substrate 202. In this embodiment, the waveguide substrate 202 includes conductive layers 206 and 208 (e.g., copper, other metal or other conductive material layers) separated by a non-conductive material 204 (e.g., FR-4, ceramic). The waveguide substrate 202 may be characterized as a PCB substrate being formed from a multilayer printed circuit board material. The cavity 210 is formed as a trench by way of a suitable subtractive process (e.g., milling, laser ablation, wet and/or dry etching). The cavity 210 forms a portion of a hollow channel (e.g., waveguide channel 134 of FIG. 1) having a predetermined depth dimension labeled 212 and a predetermined width dimension labeled 214. When mated with a corresponding cavity in a second waveguide substrate at a subsequent stage (e.g., FIG. 4), a hollow waveguide is formed having predetermined dimensions configured for propagation of mmWave signals, for example.

Figure 3:
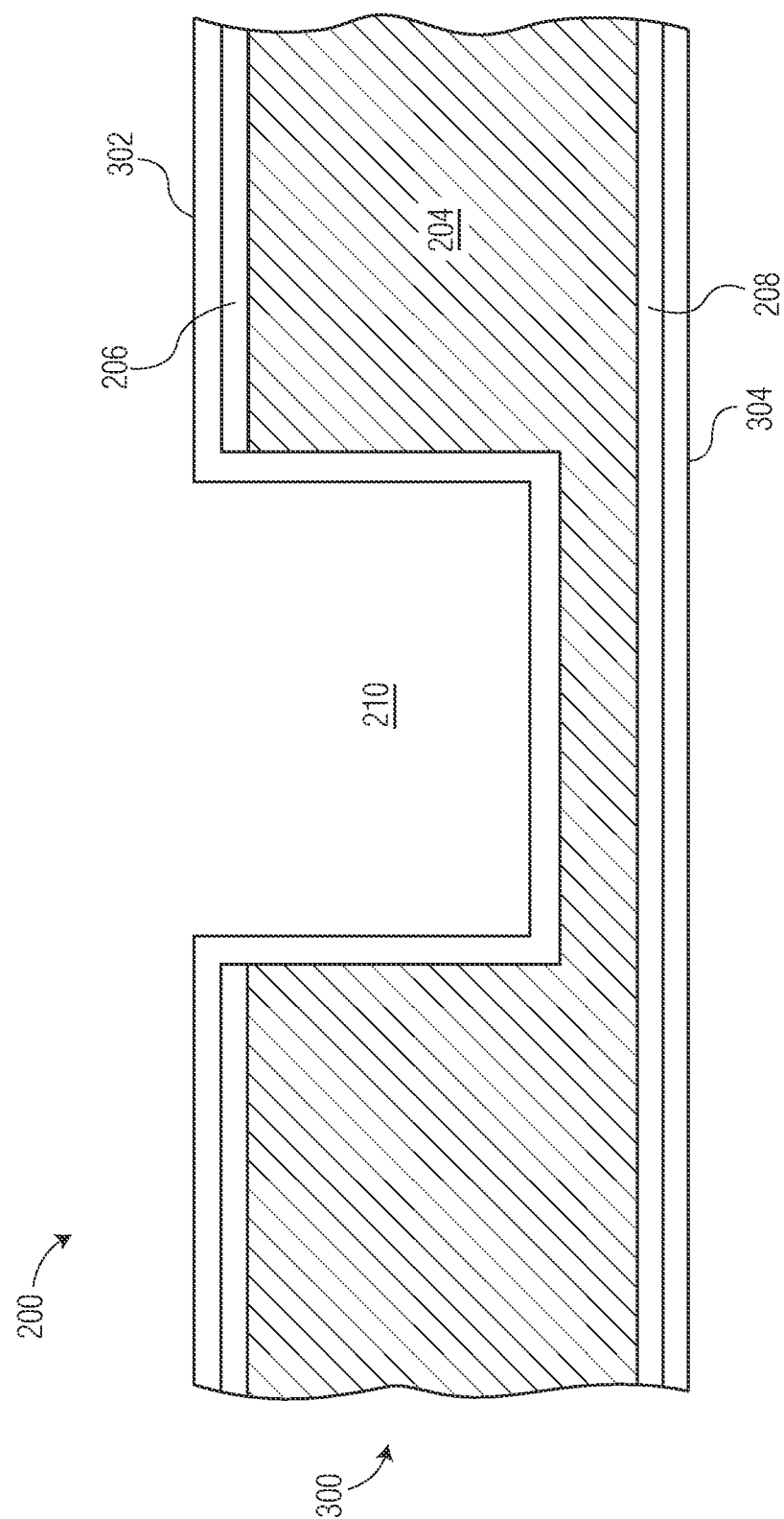

FIG. 3 illustrates the example substrate integrated waveguide 200 along line A-A of FIG. 1A at a subsequent stage of manufacture in accordance with an embodiment. At this stage of manufacture, the substrate integrated waveguide 200 includes conductive layers 302 and 304 formed over top and bottom surfaces of waveguide substrate 202 as shown in FIG. 2 to form a first portion 300 of the substrate integrated waveguide 200. The conductive layer 302 forms a conductive liner layer on sidewalls of the cavity 210. In this embodiment, the conductive layers 302 and 304 are deposited from suitable metal material such as copper or aluminum, for example.

Figure 4:
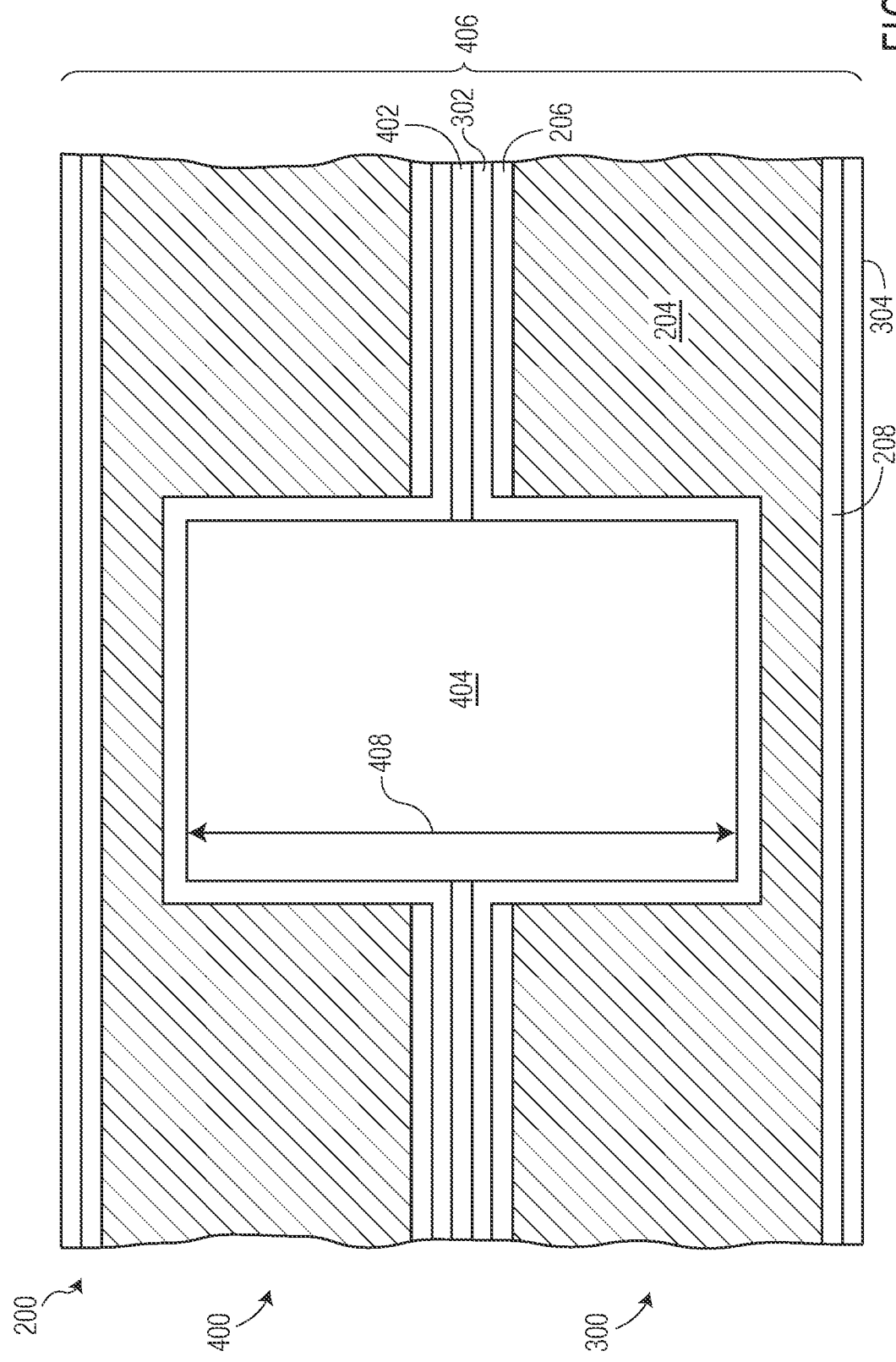

FIG. 4 illustrates the example substrate integrated waveguide 200 along line A-A of FIG. 1A at a subsequent stage of manufacture in accordance with an embodiment. At this stage of manufacture, the substrate integrated waveguide 200 includes a second portion 400 of the substrate integrated waveguide 200 affixed to the first portion 300 to form a hollow waveguide 404 in a stacked substrate configuration 406. The second portion 400 of the substrate integrated waveguide 200 is formed in a similar manner as the first portion 300 of the substrate integrated waveguide 200. The second portion 400 of the substrate integrated waveguide 200 may be formed as a mirrored copy of the first portion 300 of the substrate integrated waveguide 200 such that when joined together with the first portion 300 forms a waveguide 404 having a height dimension 408 approximately equal to twice the depth dimension 212 of FIG. 2. The first portion 300 of the substrate integrated waveguide 200 and the second portion 400 of the substrate integrated waveguide 200 are aligned with each other then joined together by way of a suitable joining material 402 disposed between the first portion 300 and the second portion 400. It may be desirable to prevent the joining material 402 from ingress into hollow waveguide 404. In some embodiments, the joining material 402 may be a non-conductive material such as an adhesive, dielectric, and the like. In some embodiments, the joining material 402 may be a conductive material such as a conductive adhesive, solder, and the like.

Figure 5:
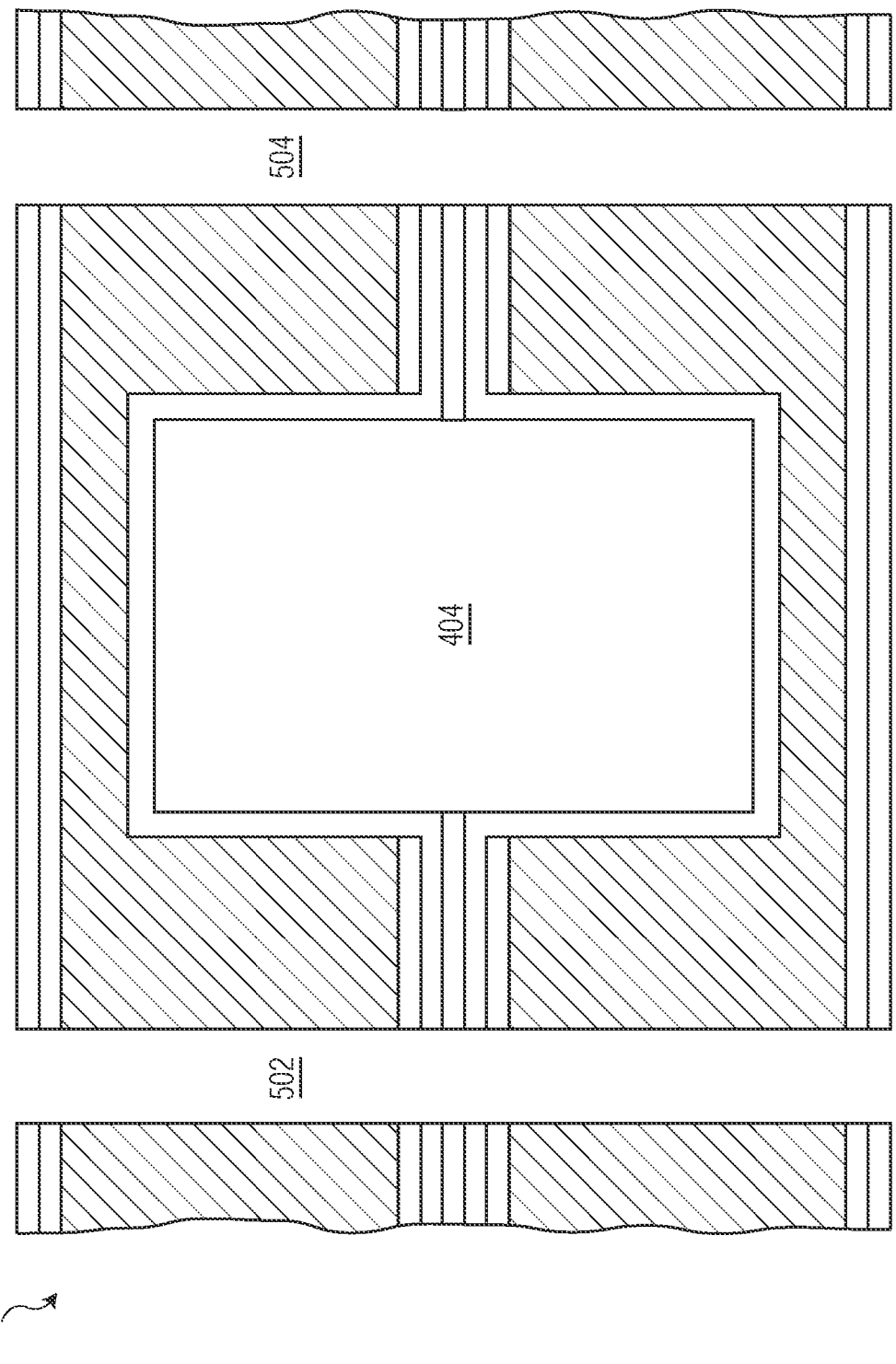

FIG. 5 illustrates the example substrate integrated waveguide 200 along line A-A of FIG. 1A at a subsequent stage of manufacture in accordance with an embodiment. At this stage of manufacture, the substrate integrated waveguide 200 includes via openings 502 and 504 formed in the stacked substrate configuration 406. The through-hole via openings 502 and 504 may be formed using known methods such as by way of drilling or etching, for example.

Figure 6:
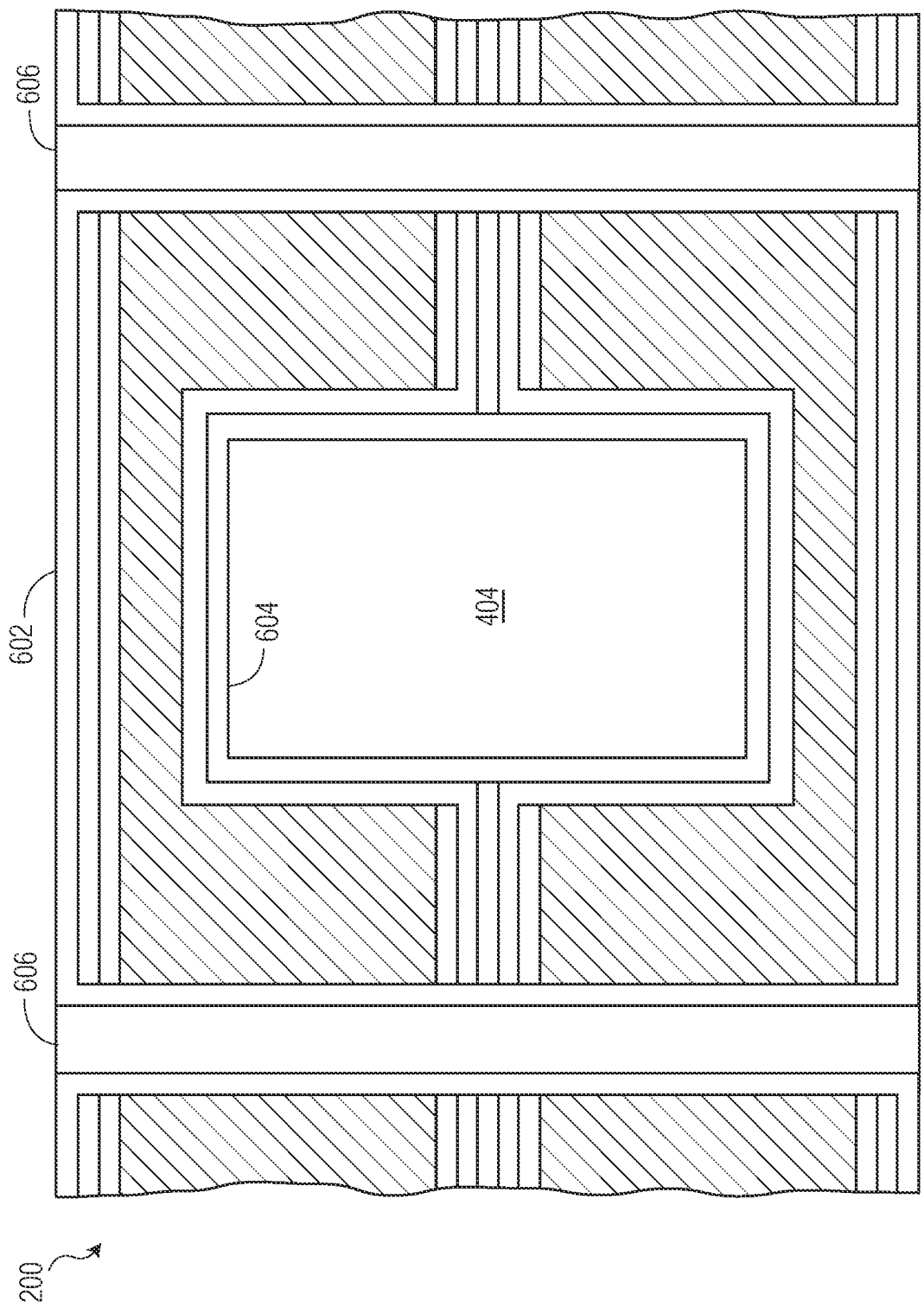

FIG. 6 illustrates the example substrate integrated waveguide 200 along line A-A of FIG. 1A at a subsequent stage of manufacture in accordance with an embodiment. At this stage of manufacture, the substrate integrated waveguide 200 includes conductive layers 602 and 604 formed on exposed surfaces such as the top and bottom surfaces, the sidewalls of the via openings, and the sidewalls of the waveguide 404 of the substrate integrated waveguide 200. The conductive layers 602 and 604 may be formed by way of a copper electroplating process, for example. After the conductive layers 602 and 604 are formed, the via openings 502 and 504 as shown in FIG. 5 formed in the substrate integrated waveguide 200 are filled with a conductive material (e.g., copper) to form conductive vias 606. The conductive vias 606 serve to interconnect conductive layers of the substrate integrated waveguide 200.

Figure 7:
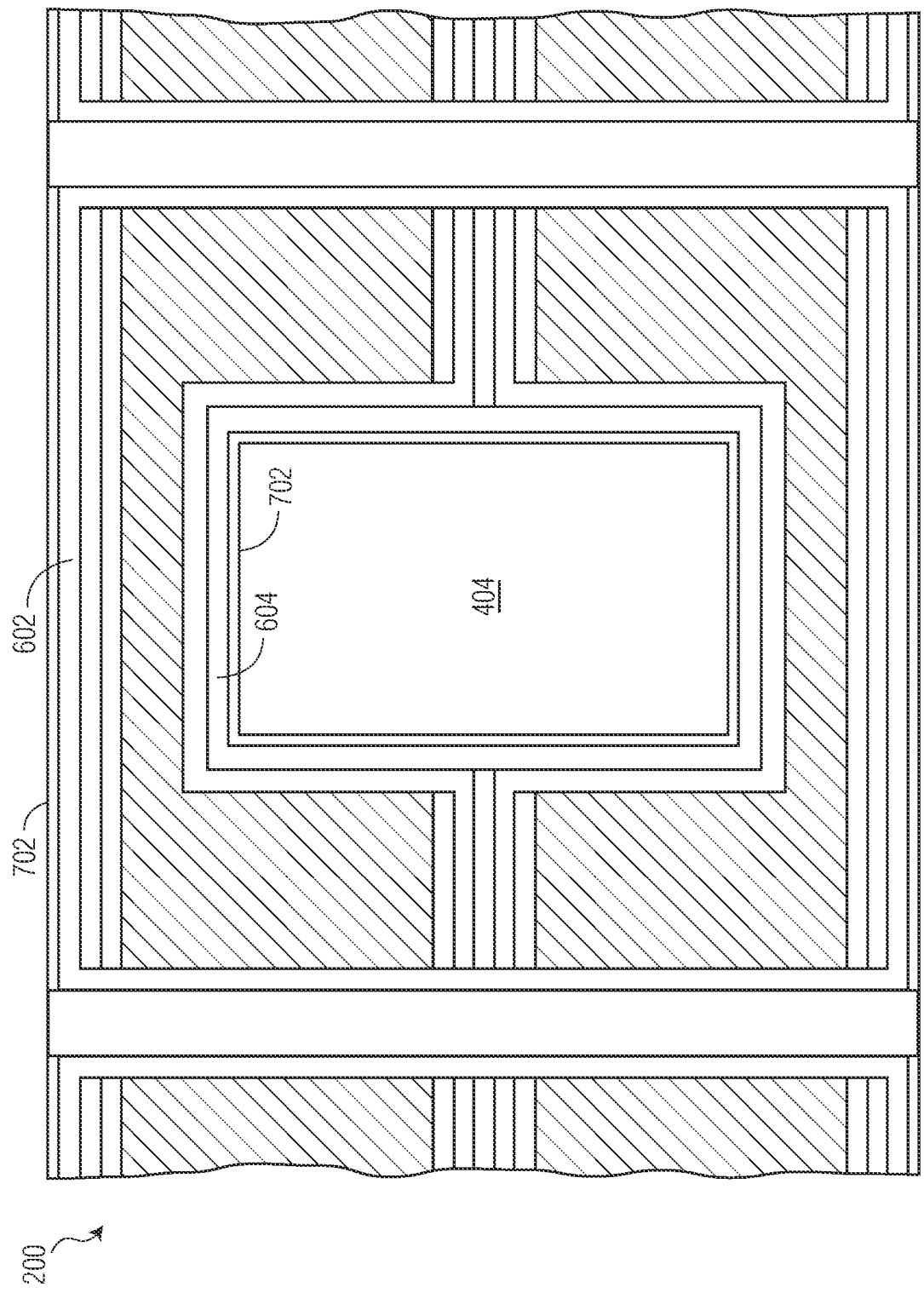

FIG. 7 illustrates the example substrate integrated waveguide 200 along line A-A of FIG. 1A at a subsequent stage of manufacture in accordance with an embodiment. At this stage of manufacture, the substrate integrated waveguide 200 includes a corrosion inhibitor layer 702 formed on exposed conductive surfaces (e.g., conductive layers 602 and 604) of the substrate integrated waveguide 200. The corrosion inhibitor layer 702 may be formed by way of electroplating, for example. The corrosion inhibitor layer 702 serves to protect and resist potential corrosion of exposed copper conductive layers and features of the substrate integrated waveguide 200.

FIG. 8 through FIG. 13 illustrate, in simplified cross-sectional views, an alternative example substrate integrated hollow waveguide 800 along line A-A of FIG. 1A at stages of manufacture in accordance with an embodiment.

Figure 8:
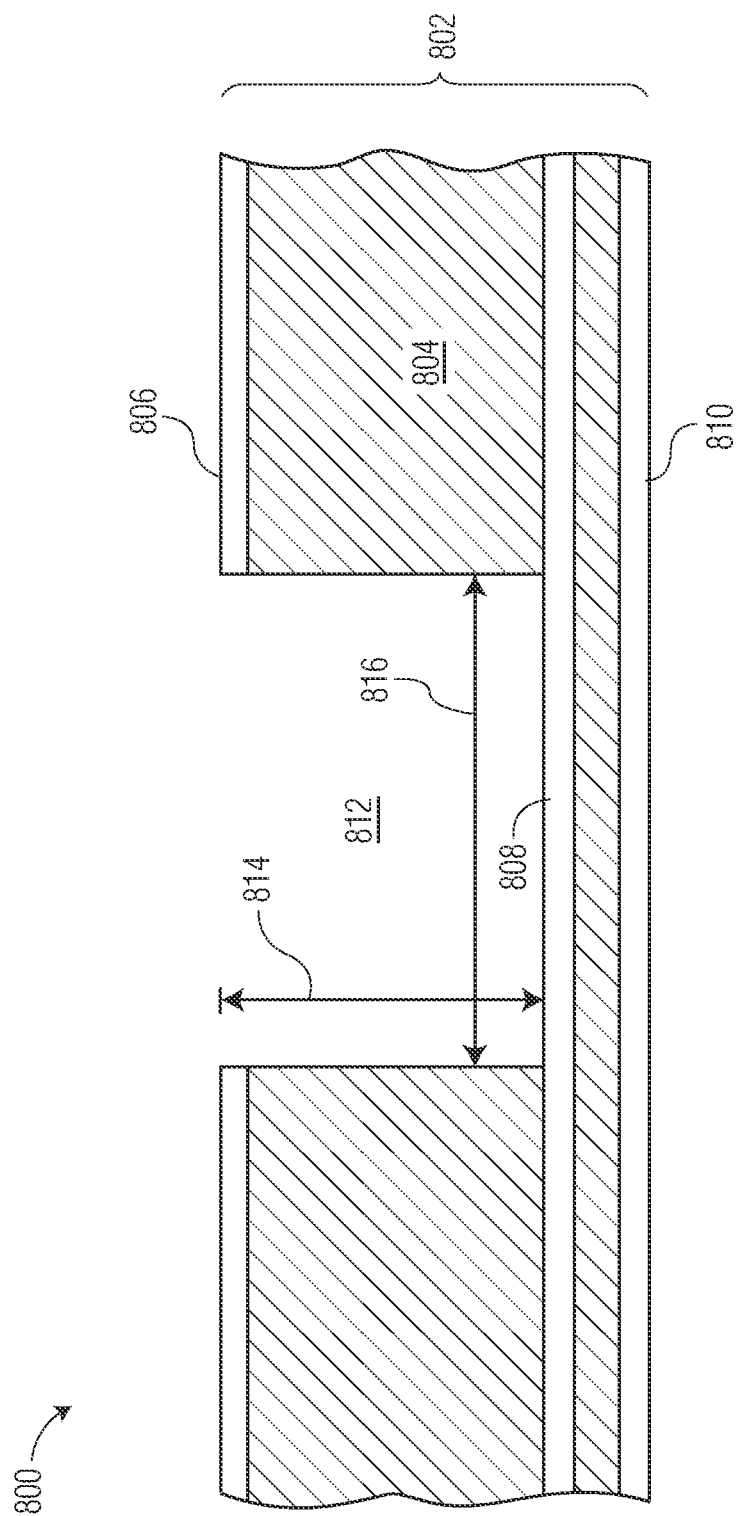
FIG. 8 through FIG. 13 illustrate, in simplified cross-sectional views, an alternative example substrate integrated hollow waveguide along line A-A of FIG. 1A at stages of manufacture in accordance with an embodiment.

FIG. 8 illustrates the example substrate integrated waveguide 800 along line A-A of FIG. 1A at a stage of manufacture in accordance with an embodiment. At this stage of manufacture, the substrate integrated waveguide 800 includes a cavity 812 formed in a multilayer laminate waveguide substrate 802. In this embodiment, the waveguide substrate 802 includes conductive layers 806, 808, and 810 (e.g., copper, other metal or other conductive material layers) separated by a non-conductive material 804 (e.g., FR-4, ceramic). The waveguide substrate 802 may be characterized as a PCB substrate being formed from a multilayer printed circuit board material. The cavity 812 is formed as a trench by way of a suitable subtractive process (e.g., milling, laser ablation, wet and/or dry etching). In this embodiment, conductive layer 808 serves as a stop layer to assist control of the depth dimension labeled 814. The cavity 812 forms a portion of a hollow channel (e.g., waveguide channel 134 of FIG. 1) having the predetermined depth dimension 814 and a predetermined width dimension labeled 816. When mated with a corresponding cavity in a second waveguide substrate at a subsequent stage (e.g., FIG. 10), a hollow waveguide is formed having predetermined dimensions configured for propagation of mmWave signals, for example.

Figure 9:
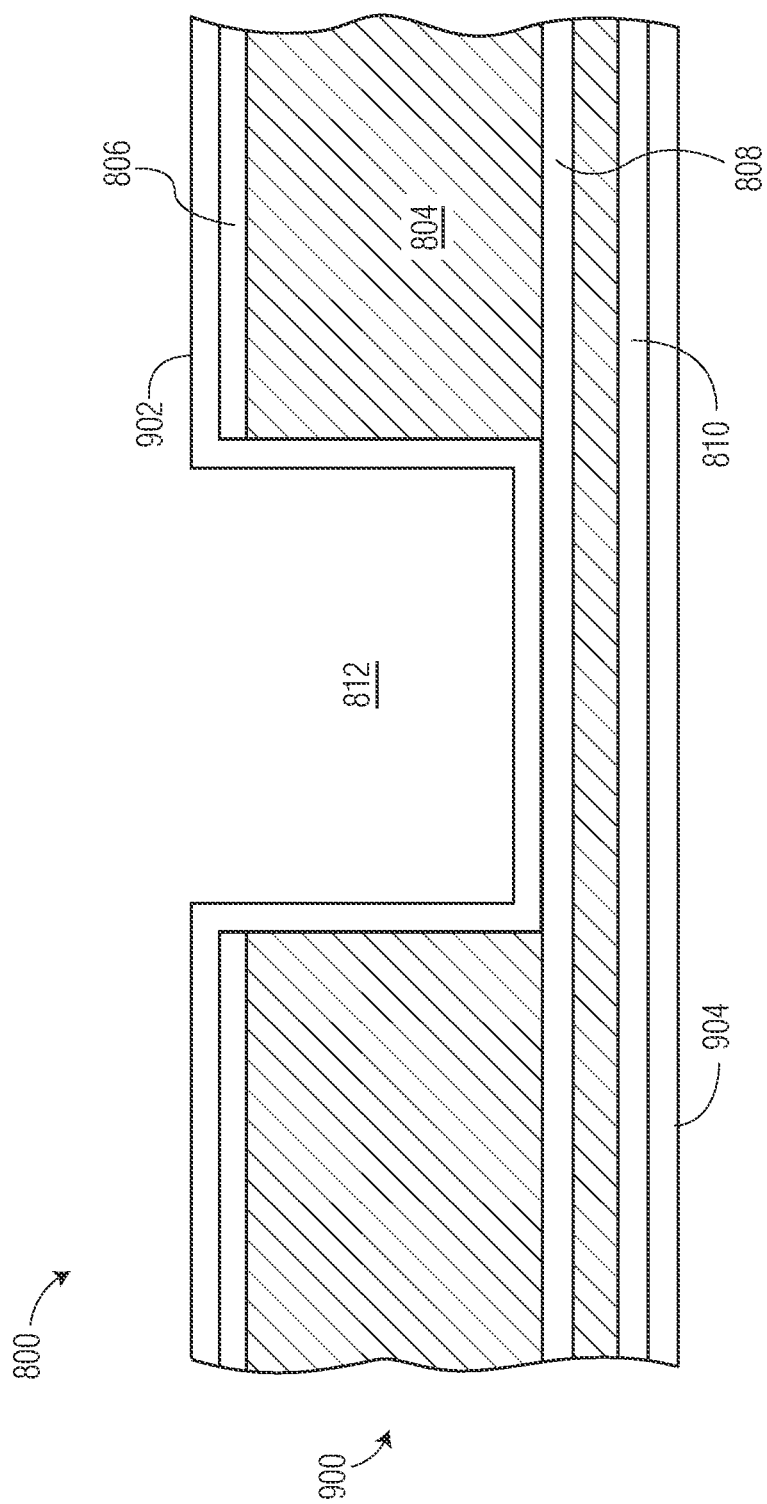

FIG. 9 illustrates the example substrate integrated waveguide 800 along line A-A of FIG. 1A at a subsequent stage of manufacture in accordance with an embodiment. At this stage of manufacture, the substrate integrated waveguide 800 includes conductive layers 902 and 904 formed over top and bottom surfaces of waveguide substrate 802 of FIG. 8 to form a first portion 900 of the substrate integrated waveguide 800. The conductive layer 902 forms a conductive liner layer on sidewalls of the cavity 812. In this embodiment, the conductive layers 902 and 904 are deposited or electroplated from suitable metal material such as copper or aluminum, for example.

Figure 10:
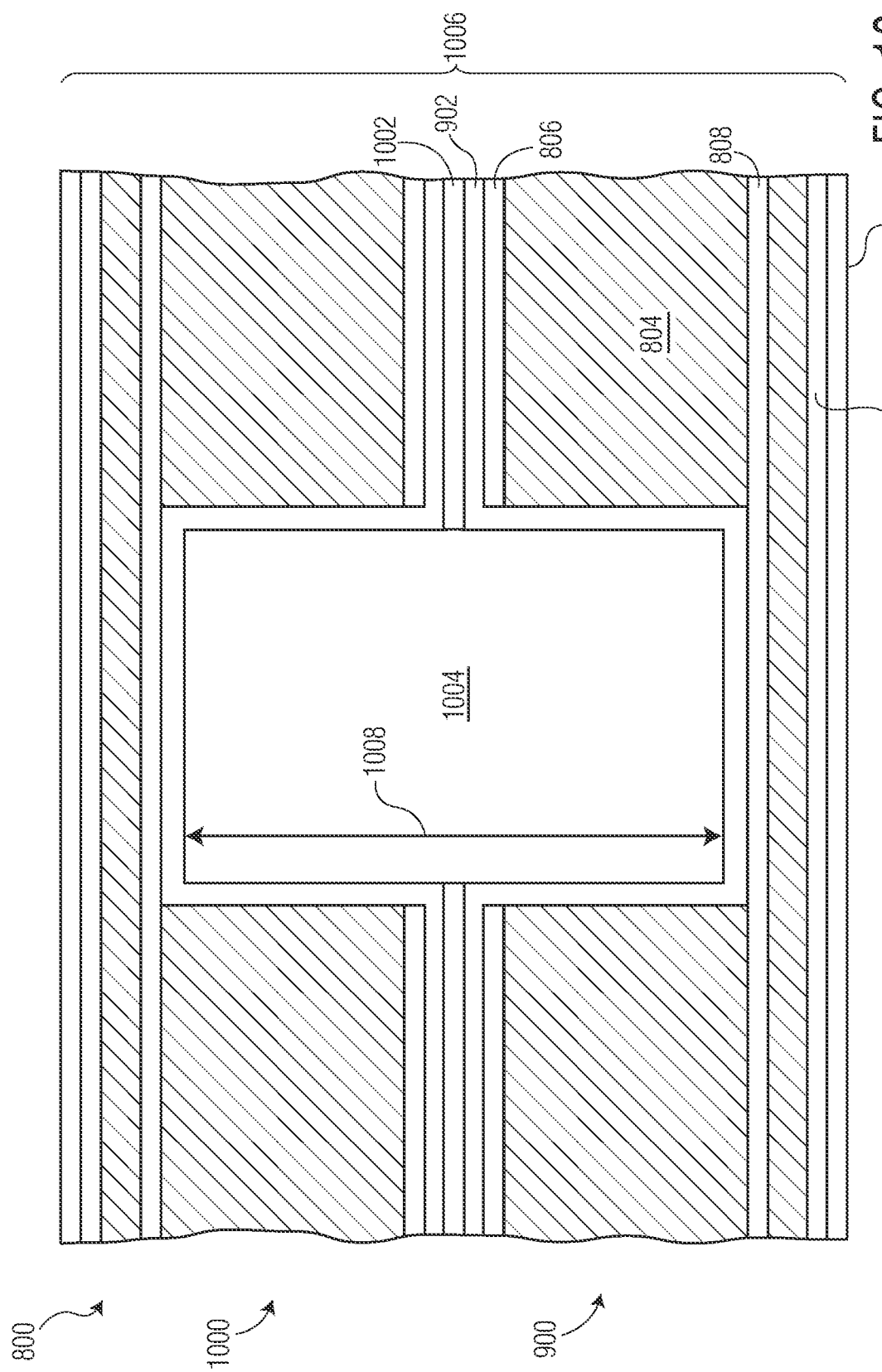

FIG. 10 illustrates the example substrate integrated waveguide 800 along line A-A of FIG. 1A at a subsequent stage of manufacture in accordance with an embodiment. At this stage of manufacture, the substrate integrated waveguide 800 includes a second portion 1000 of the substrate integrated waveguide 800 affixed to the first portion 900 to form a hollow waveguide 1004 in a stacked substrate configuration 1006. The second portion 1000 of the substrate integrated waveguide 800 is formed in a similar manner as the first portion 900 of the substrate integrated waveguide 800. For example, the second portion 1000 of the substrate integrated waveguide 800 may be formed as a mirrored copy image of the first portion 900 of the substrate integrated waveguide 800 such that when joined together with the first portion 900 forms a waveguide 1004 having a height dimension 1008 approximately equal to twice the depth dimension 814 of FIG. 8. The first portion 900 of the substrate integrated waveguide 800 and the second portion 1000 of the substrate integrated waveguide 800 are aligned with each other then joined together by way of a suitable joining material 1002 disposed between the first portion 900 and the second portion 1000. It may be desirable to prevent the joining material 1002 from ingress into hollow waveguide 1004. In some embodiments, the joining material 1002 may be a non-conductive material such as an adhesive, dielectric, and the like. In some embodiments, the joining material 1002 may be a conductive material such as a conductive adhesive, solder, and the like.

Figure 11:
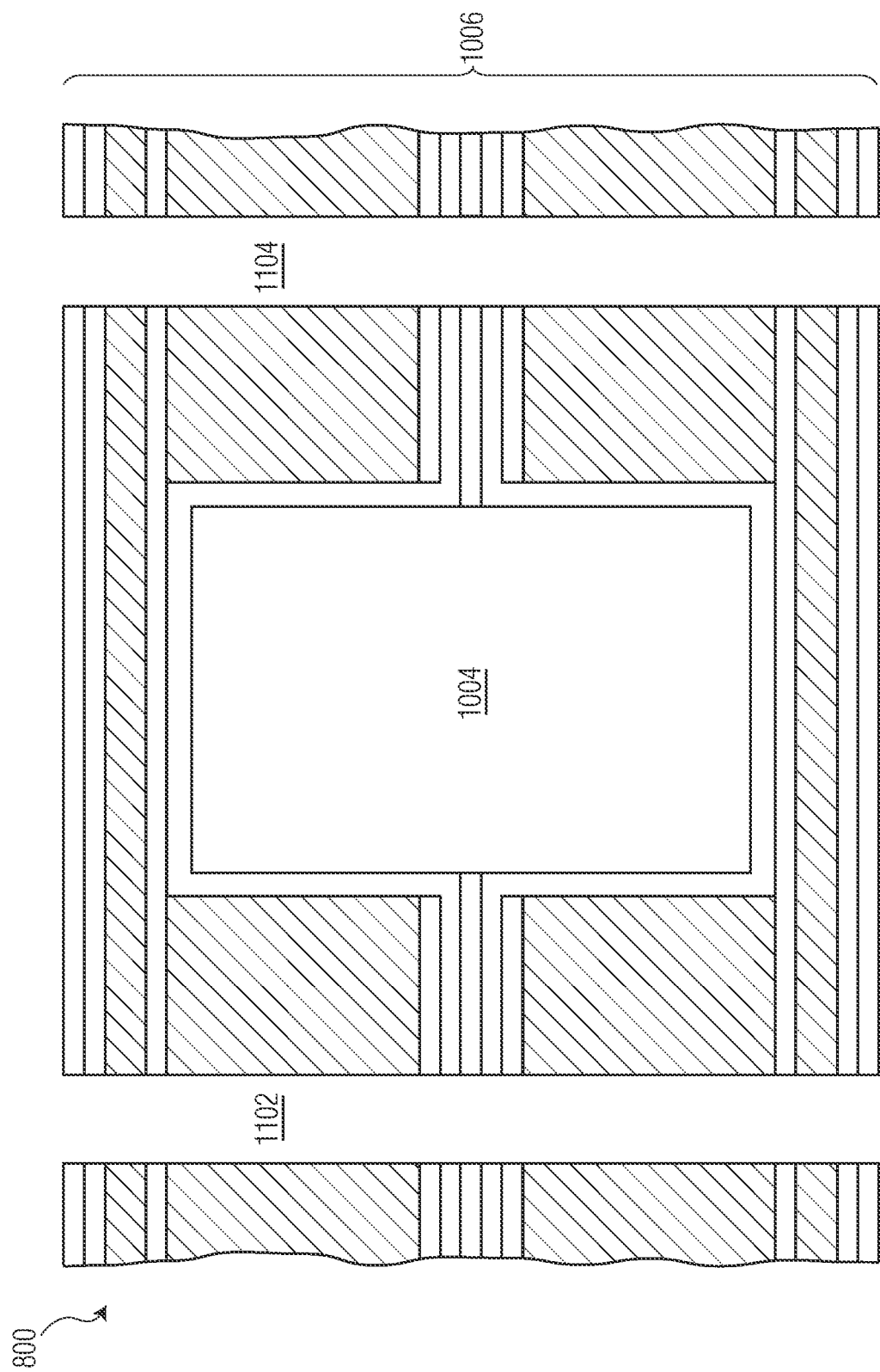

FIG. 11 illustrates the example substrate integrated waveguide 800 along line A-A of FIG. 1A at a subsequent stage of manufacture in accordance with an embodiment. At this stage of manufacture, the substrate integrated waveguide 800 includes via openings 1102 and 1104 formed in the stacked substrate configuration 1006. The through-hole via openings 1102 and 1104 may be formed using known methods such as by way of drilling or etching, for example.

Figure 12:
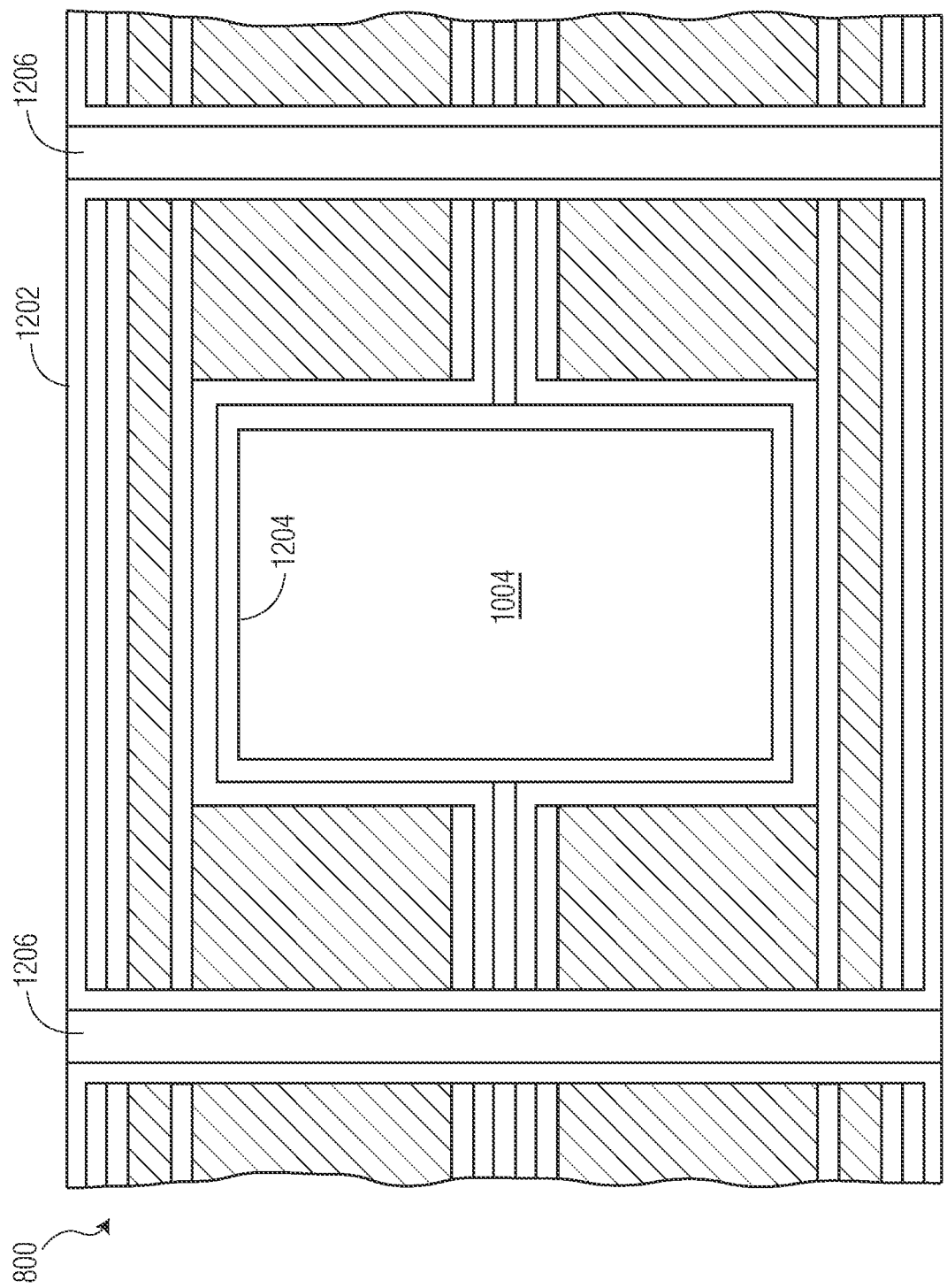

FIG. 12 illustrates the example substrate integrated waveguide 800 along line A-A of FIG. 1A at a subsequent stage of manufacture in accordance with an embodiment. At this stage of manufacture, the substrate integrated waveguide 800 includes conductive layers 1202 and 1204 formed on exposed surfaces such as the top and bottom surfaces, the sidewalls of the via openings, and the sidewalls of the waveguide 1004 of the substrate integrated waveguide 800. The conductive layers 1202 and 1204 may be formed by way of a copper electroplating process, for example. After the conductive layers 1202 and 1204 are formed, the via openings 1102 and 1104 as shown in FIG. 11 formed in the substrate integrated waveguide 800 are filled with a conductive material (e.g., copper) to form conductive vias 1206. The conductive vias 1206 serve to interconnect conductive layers of the substrate integrated waveguide 800.

Figure 13:
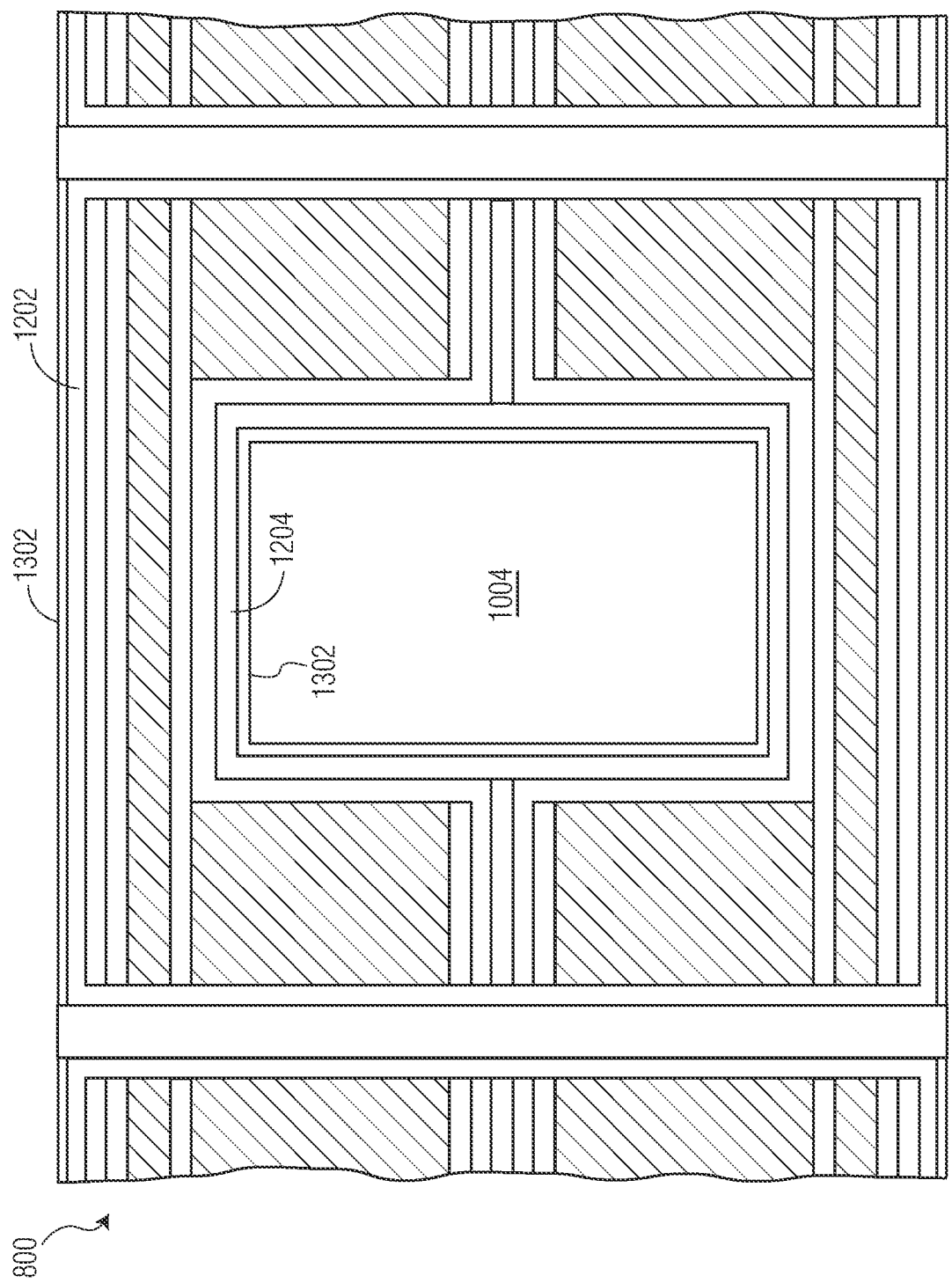

FIG. 13 illustrates the example substrate integrated waveguide 800 along line A-A of FIG. 1A at a subsequent stage of manufacture in accordance with an embodiment. At this stage of manufacture, the substrate integrated waveguide 800 includes a corrosion inhibitor layer 1302 formed on exposed conductive surfaces (e.g., conductive layers 1202 and 1204) of the substrate integrated waveguide 800. The corrosion inhibitor layer 1302 may be formed by way of electroplating, for example. The corrosion inhibitor layer 1302 serves to protect and resist potential corrosion of exposed copper conductive layers and features of the substrate integrated waveguide 800.

FIG. 14 through FIG. 17 illustrate, in simplified cross-sectional views, another alternative example substrate integrated hollow waveguide 1400 along line A-A of FIG. 1A at stages of manufacture in accordance with an embodiment.

Figure 14:
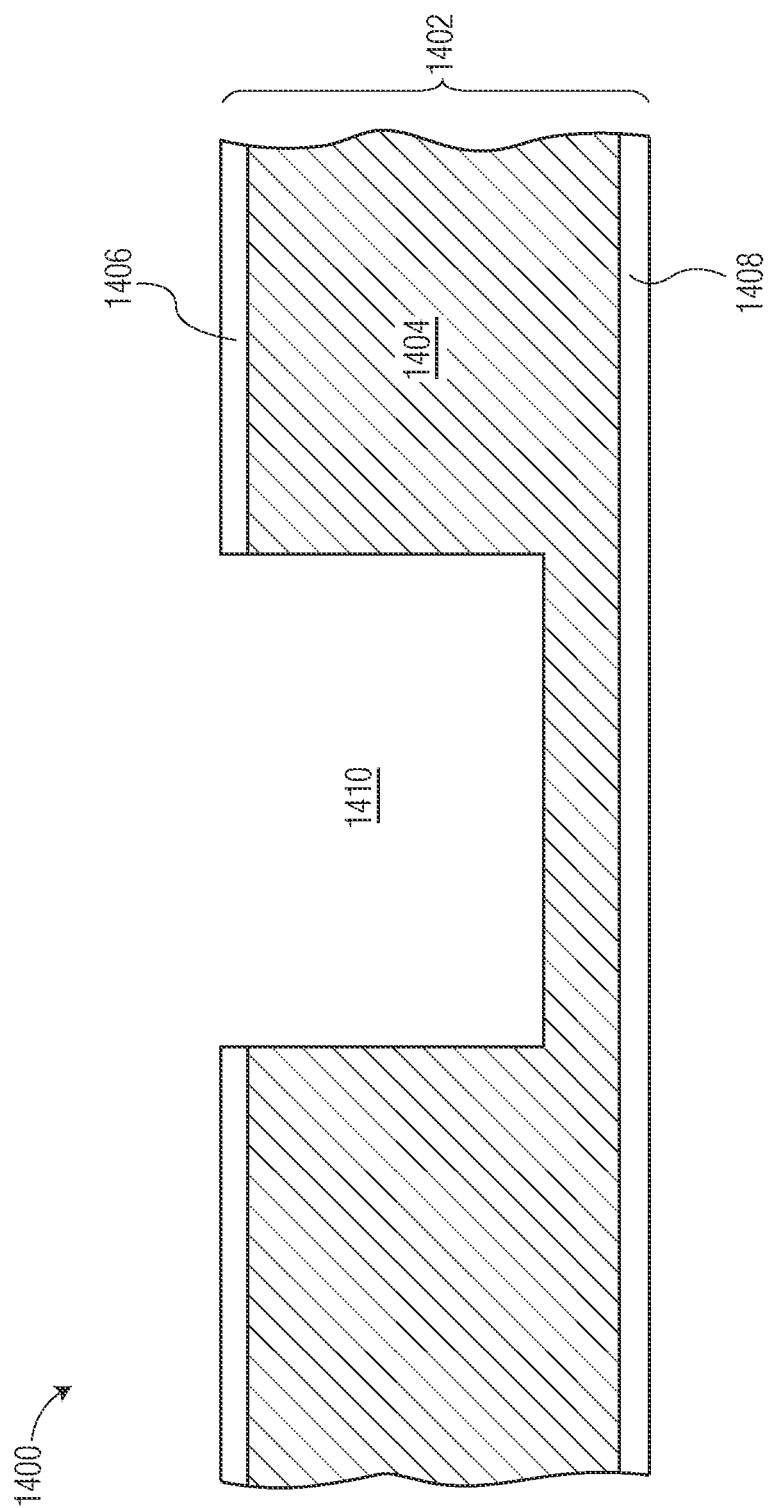
FIG. 14 through FIG. 17 illustrate, in simplified cross-sectional views, another alternative example substrate integrated hollow waveguide along line A-A of FIG. 1A at stages of manufacture in accordance with an embodiment.

FIG. 14 illustrates the example substrate integrated waveguide 1400 along line A-A of FIG. 1A at a stage of manufacture in accordance with an embodiment. At this stage of manufacture, the substrate integrated waveguide 1400 includes a cavity 1410 formed in a multilayer laminate waveguide substrate 1402. In this embodiment, the waveguide substrate 1402 includes conductive layers 1406 and 1408 (e.g., copper, other metal or other conductive material layers) separated by a non-conductive material 1404 (e.g., FR-4, ceramic). The waveguide substrate 1402 may be characterized as a PCB substrate being formed from a multilayer printed circuit board material. The cavity 1410 is formed as a trench by way of a suitable subtractive process (e.g., milling, laser ablation, wet and/or dry etching). The cavity 1410 forms a portion of a hollow channel (e.g., waveguide channel 134 of FIG. 1) having a predetermined depth dimension and a predetermined width dimension. When mated with a corresponding cavity in a second waveguide substrate at a subsequent stage (e.g., FIG. 17), a hollow waveguide is formed having predetermined dimensions configured for propagation of mmWave signals, for example.

Figure 15:
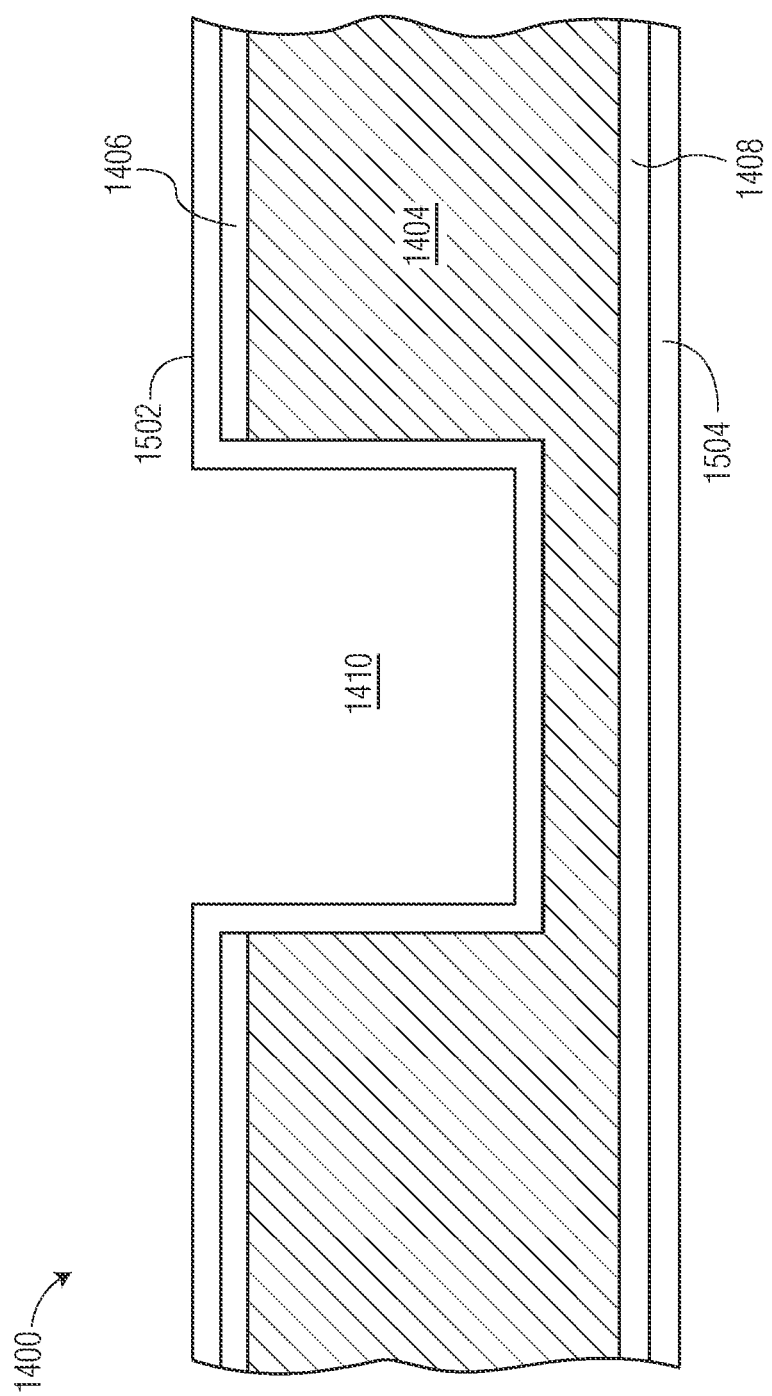

FIG. 15 illustrates the example substrate integrated waveguide 1400 along line A-A of FIG. 1A at a subsequent stage of manufacture in accordance with an embodiment. At this stage of manufacture, the substrate integrated waveguide 1400 includes conductive layers 1502 and 1504 formed over top and bottom surfaces of waveguide substrate 1402 as shown in FIG. 14. The conductive layer 1502 forms a conductive liner layer on sidewalls of the cavity 1410. In this embodiment, the conductive layers 1502 and 1504 are deposited from suitable metal material such as copper or aluminum, for example.

Figure 16:
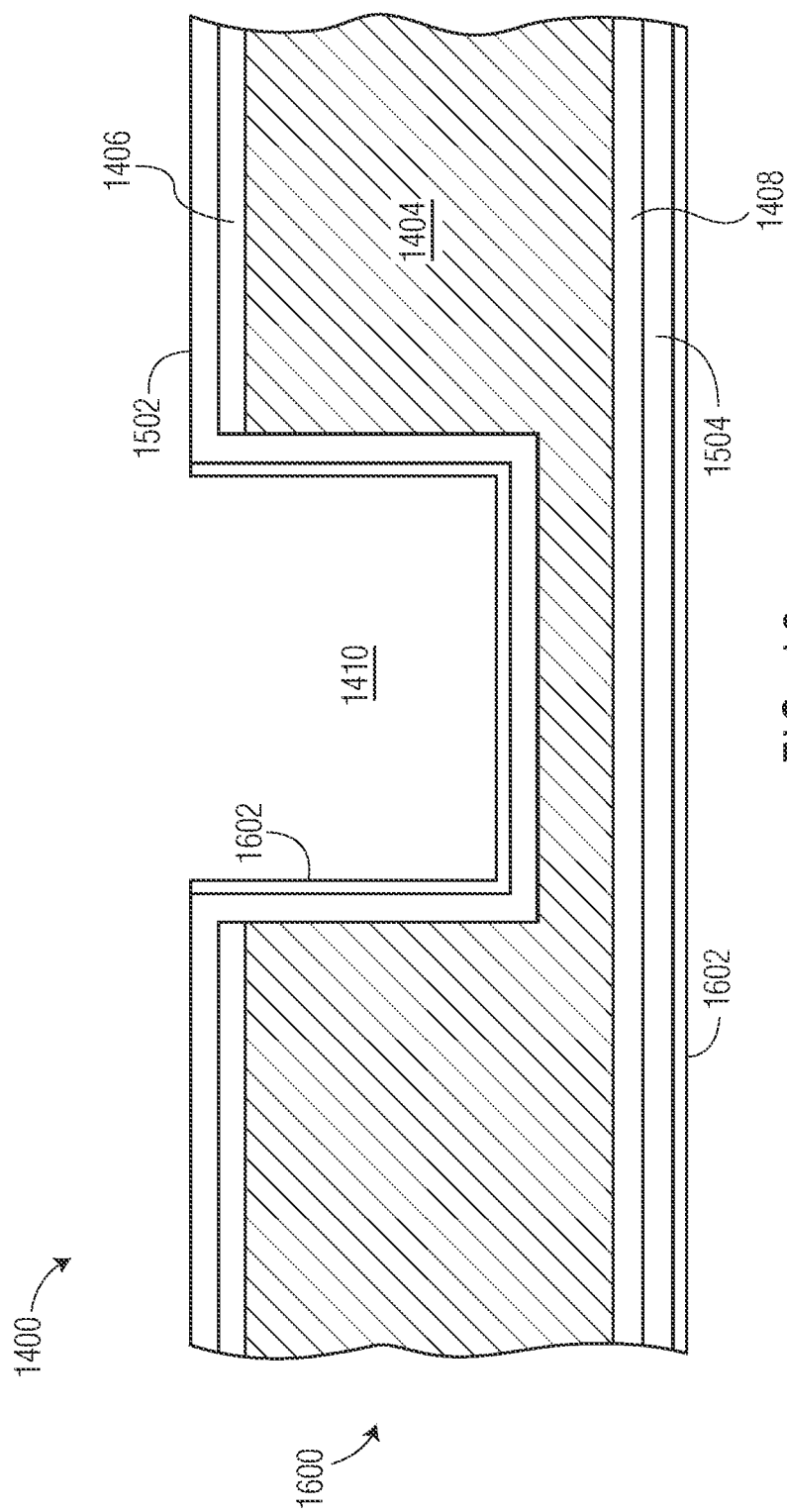

FIG. 16 illustrates the example substrate integrated waveguide 1400 along line A-A of FIG. 1A at a subsequent stage of manufacture in accordance with an embodiment. At this stage of manufacture, the substrate integrated waveguide 1400 includes a corrosion inhibitor layer 1602 formed on exposed conductive surfaces to form a first portion 1600 of the substrate integrated waveguide 1400. The corrosion inhibitor layer 1602 is formed on exposed conductive surfaces of conductive layer 1502 within the cavity 1410 and conductive layer 1504 at the bottom of the substrate integrated waveguide 1400. The corrosion inhibitor layer 1602 may be formed by way of selective electroplating, for example. The corrosion inhibitor layer 1602 serves to protect and resist potential corrosion of exposed copper conductive layers and features of the substrate integrated waveguide 1400.

Figure 17:
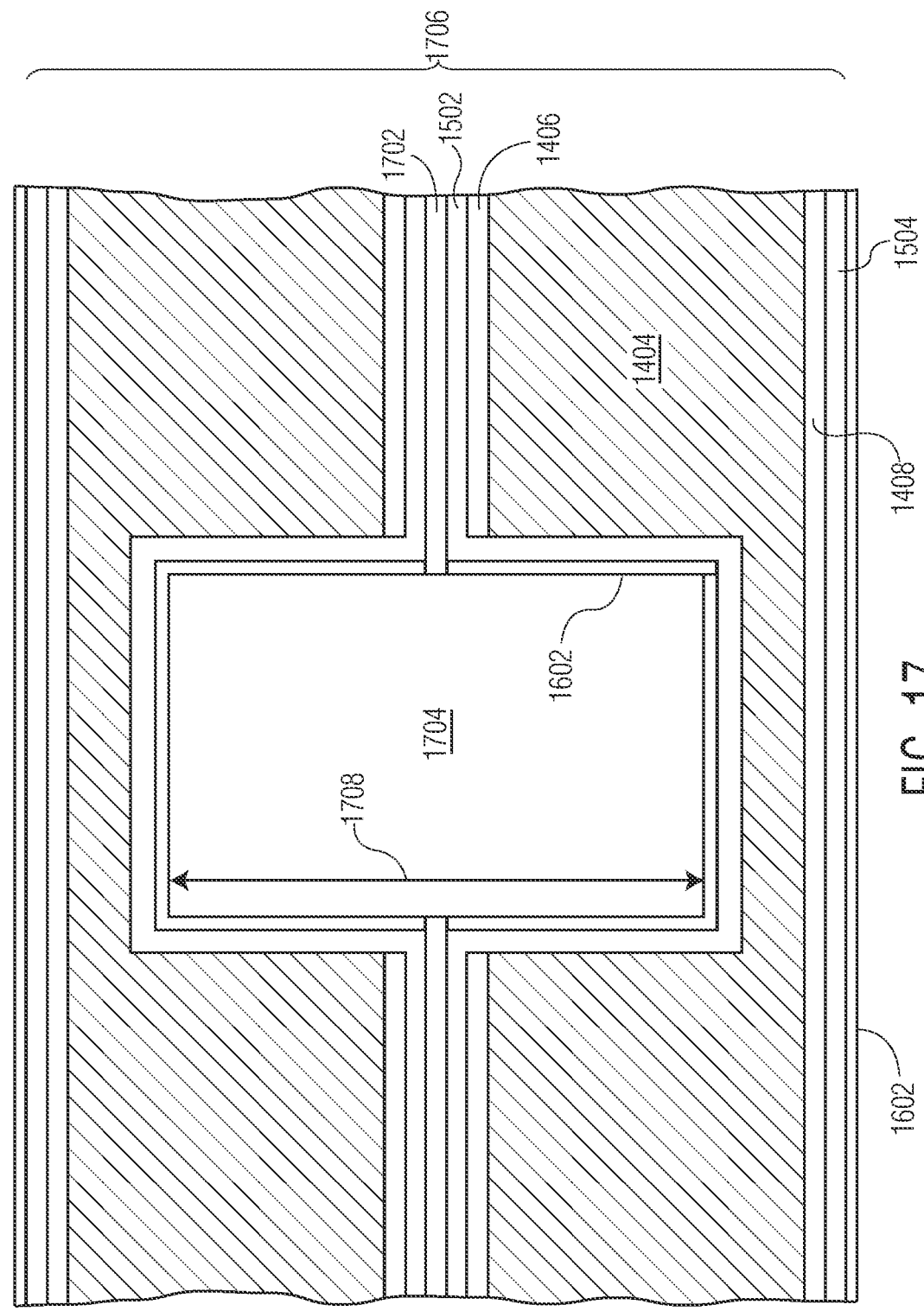

FIG. 17 illustrates the example substrate integrated waveguide 1400 along line A-A of FIG. 1A at a subsequent stage of manufacture in accordance with an embodiment. At this stage of manufacture, the substrate integrated waveguide 1400 includes a second portion 1700 of the substrate integrated waveguide 1400 affixed to the first portion 1600 to form a hollow waveguide 1704 in a stacked substrate configuration 1706. The second portion 1700 of the substrate integrated waveguide 1400 is formed in a similar manner as the first portion 1600 of the substrate integrated waveguide 1400. The second portion 1700 of the substrate integrated waveguide 1400 may be formed as a mirrored image of the first portion 1600 of the substrate integrated waveguide 1400 such that when joined together with the first portion 1600 forms a waveguide 1704 having a height dimension 1708 approximately equal to twice the depth dimension of the cavity of FIG. 14. The first portion 1600 of the substrate integrated waveguide 1400 and the second portion 1700 of the substrate integrated waveguide 1400 are aligned with each other then joined together by way of a suitable joining material 1702 disposed between the first portion 1600 and the second portion 1700. It may be desirable to prevent the joining material 1702 from ingress into hollow waveguide 1704. In this embodiment, the joining material 1702 may be characterized as a conductive material such as a conductive adhesive, solder, and the like.

Figure 18:
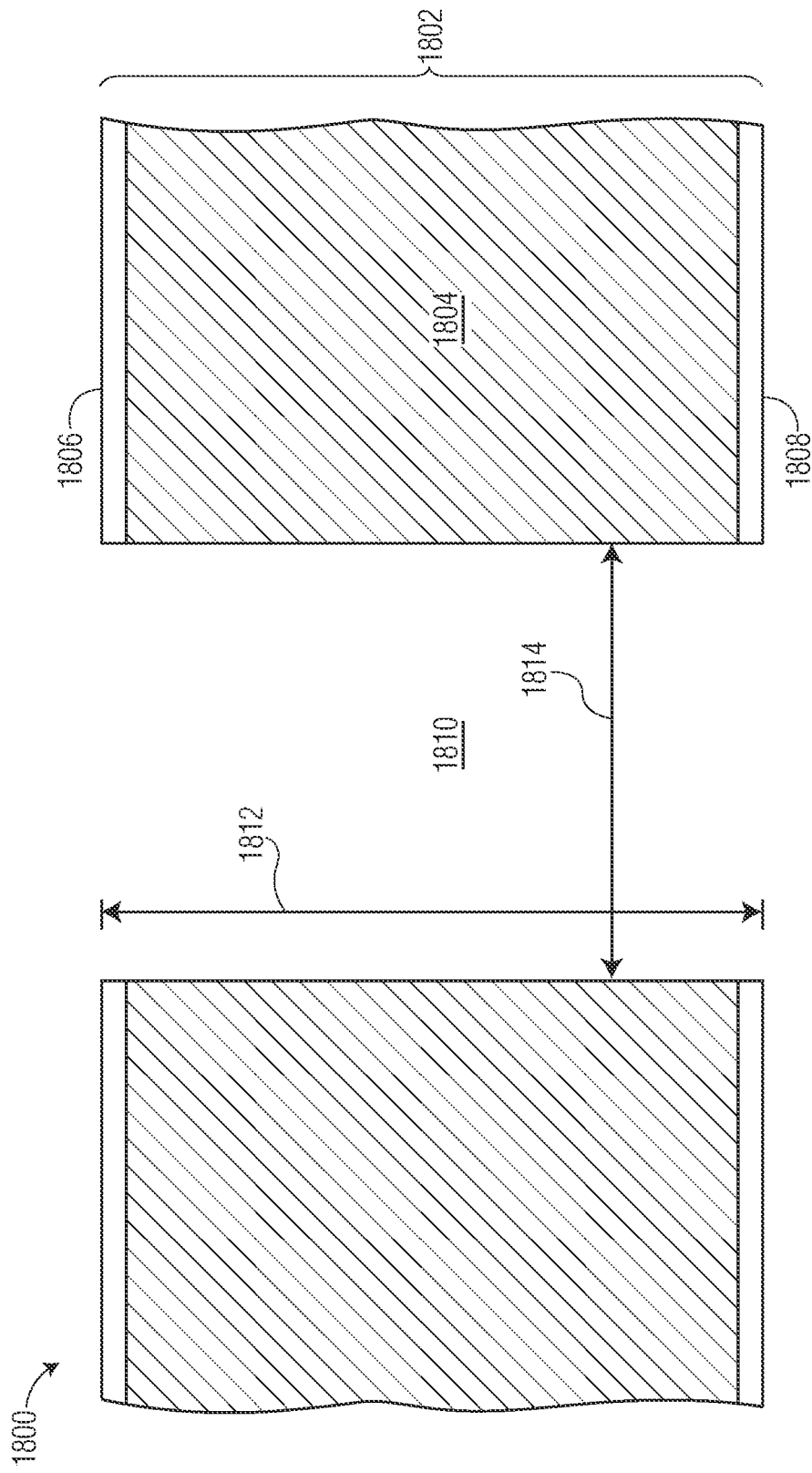

FIG. 18 through FIG. 21 illustrate, in simplified cross-sectional views, yet another alternative example substrate integrated hollow waveguide along line A-A of FIG. 1A at stages of manufacture in accordance with an embodiment. In this embodiment, a full height waveguide is formed in a substrate FIG. 18 illustrates the example substrate integrated waveguide 1800 along line A-A of FIG. 1A at a stage of manufacture in accordance with an embodiment. At this stage of manufacture, the substrate integrated waveguide 1800 includes a through cavity or slot 1810 formed in a multilayer laminate waveguide substrate 1802. In this embodiment, the waveguide substrate 1802 includes conductive layers 1806 and 1808 (e.g., copper, other metal or other conductive material layers) separated by a non-conductive material 1804 (e.g., FR-4, ceramic). The waveguide substrate 1802 may be characterized as a PCB substrate being formed from a multilayer printed circuit board material. The cavity 1810 is formed as a slot through the waveguide substrate 1802 by way of a suitable subtractive process (e.g., milling, laser ablation, wet and/or dry etching). The cavity 1810 forms a full height hollow channel (e.g., waveguide channel 134 of FIG. 1) having a predetermined depth dimension labeled 1812 and a predetermined width dimension labeled 1814 configured for propagation of mmWave signals, for example.

FIG. 19 illustrates the example substrate integrated waveguide 1800 along line A-A of FIG. 1A at a subsequent stage of manufacture in accordance with an embodiment. At this stage of manufacture, the substrate integrated waveguide 1800 includes a conductive layer 1902 formed over top and bottom surfaces of waveguide substrate 1802 as shown in FIG. 18. The conductive layer 1902 forms a conductive liner layer on sidewalls of the cavity 1810. In this embodiment, the conductive layer 1902 is deposited from suitable metal material such as copper or aluminum, for example.

Figure 20:
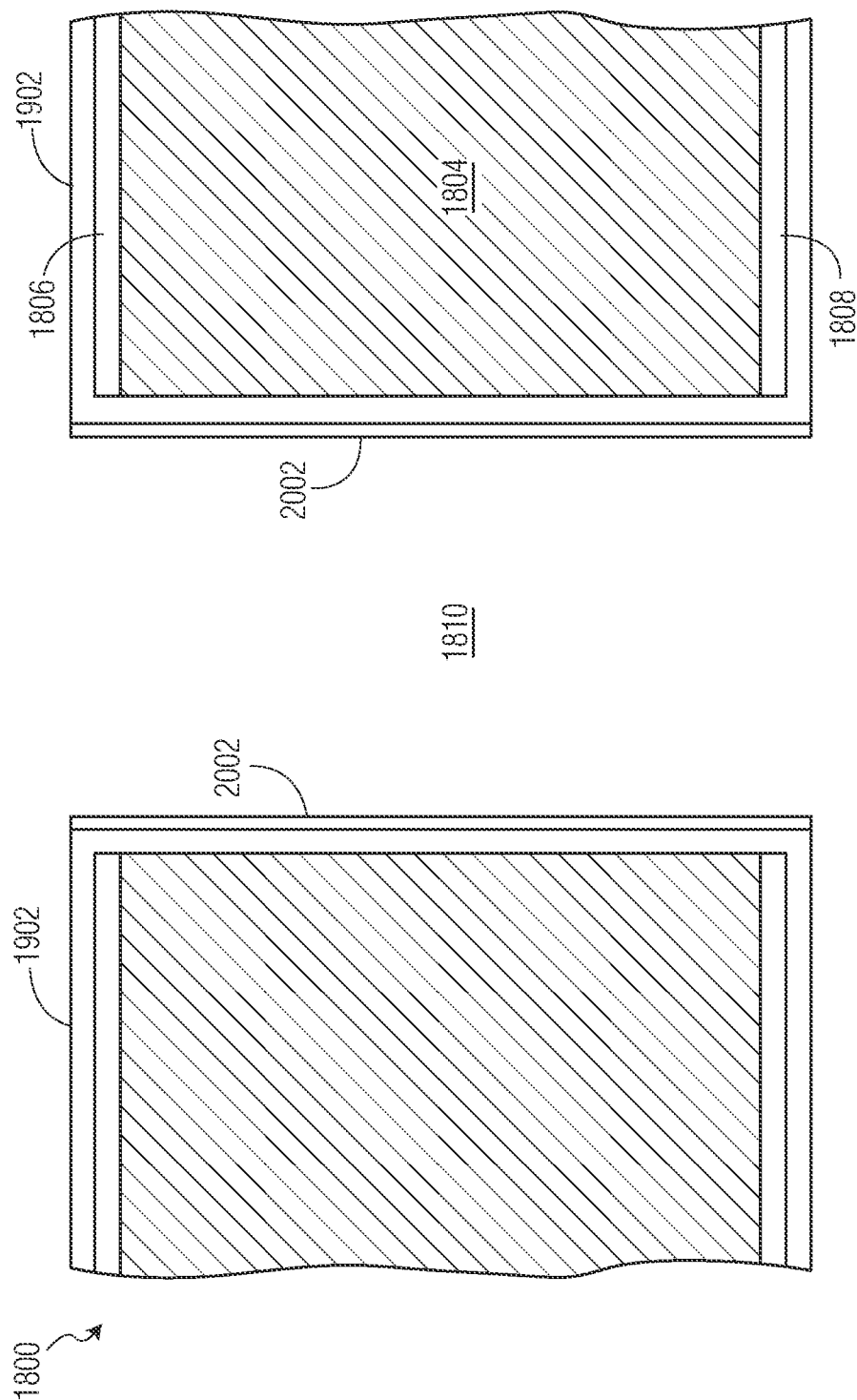

FIG. 20 illustrates the example substrate integrated waveguide 1800 along line A-A of FIG. 1A at a subsequent stage of manufacture in accordance with an embodiment. At this stage of manufacture, the substrate integrated waveguide 1800 includes a corrosion inhibitor layer 2002 formed on exposed conductive surfaces of conductive layer 1902 within the cavity 1810 of the substrate integrated waveguide 1800. The corrosion inhibitor layer 2002 may be formed by way of selective electroplating, for example. The corrosion inhibitor layer 2002 serves to protect and resist potential corrosion of exposed copper conductive layers and features of the substrate integrated waveguide 1800.

Figure 21:
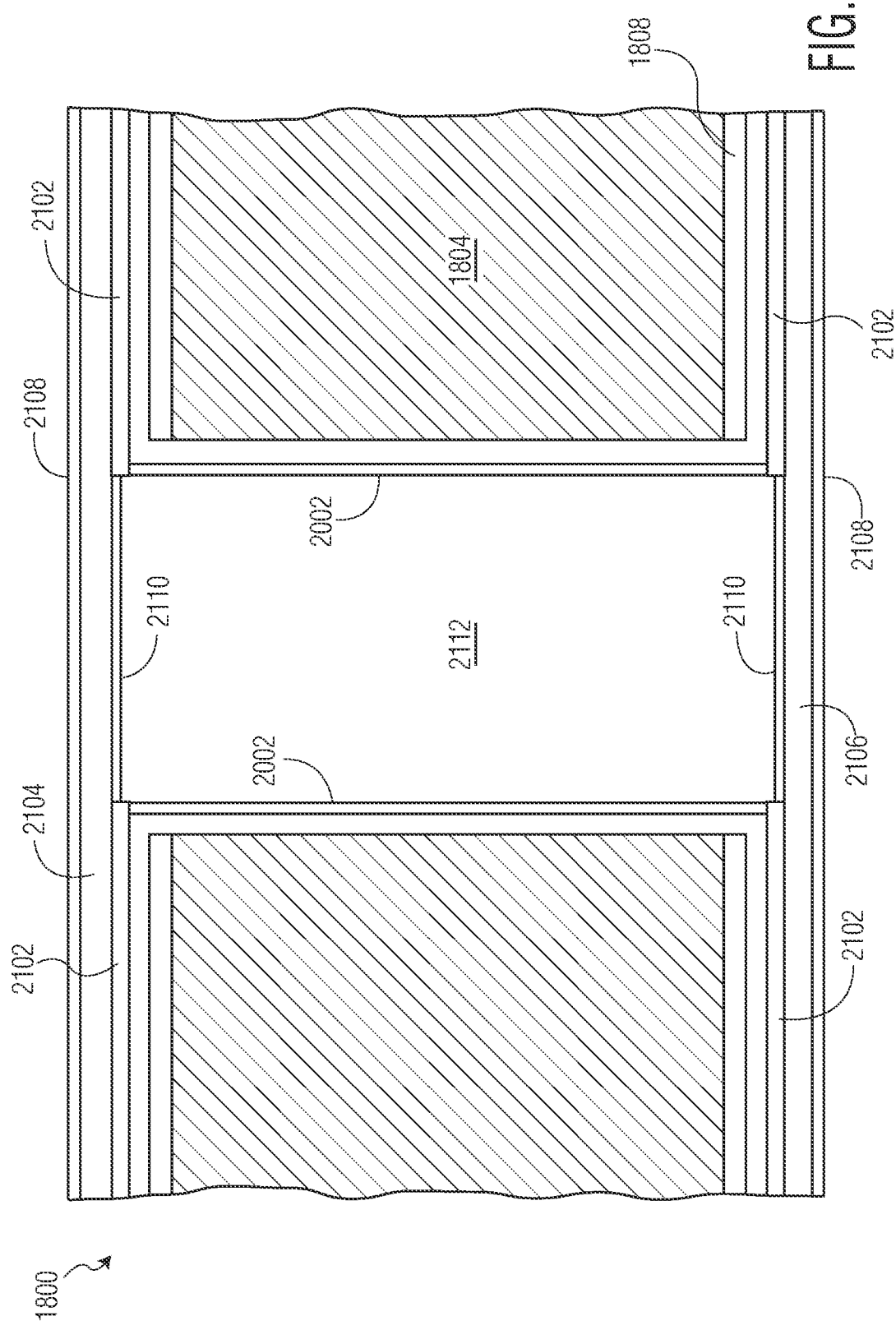

FIG. 21 illustrates the example substrate integrated waveguide 1800 along line A-A of FIG. 1A at a subsequent stage of manufacture in accordance with an embodiment. At this stage of manufacture, the substrate integrated waveguide 1800 includes conductive plates (e.g., copper sheet metal, multilayer PCB material) 2104 and 2106 attached at top and bottom surfaces the substrate integrated waveguide 1800. In this embodiment, the conductive plates 2104 and 2106 are attached to the respective surfaces the substrate integrated waveguide 1800 to form hollow waveguide 2112. The conductive plates 2104 and 2106 are affixed to the top and bottom surfaces the substrate integrated waveguide 1800 by way of a suitable joining material 2102 disposed between the conductive plates 2104 and 2106 and respective surfaces the substrate integrated waveguide 1800. It may be desirable to prevent the joining material 2102 from ingress into hollow waveguide 2112. In this embodiment, the joining material 2102 may be characterized as a conductive material such as a conductive adhesive, solder, and the like. Subsequent corrosion inhibitor layers 2108 and 2110 are formed on exposed surfaces of the conductive plates 2104 and 2106 prior to assembly. For example, corrosion inhibitor layers 2108 are formed on outer exposed surfaces of the conductive plates 2104 and 2106 and corrosion inhibitor layers 2110 are formed on inner exposed surfaces of the conductive plates 2104 and 2106 within the waveguide 2112. The corrosion inhibitor layers 2108 and 2110 may be formed by way of selective electroplating, for example. The corrosion inhibitor layers 2108 and 2110 serve to protect and resist potential corrosion of exposed copper conductive layers and features of the substrate integrated waveguide 1800. In some embodiments, the substrate integrated waveguide 1800 may be stacked over another substrate integrated waveguide 1800 to form a multilayer or multichannel waveguide, for example.

Generally, there is provided, a method including forming a first cavity in a first substrate, the first cavity having a first depth; forming a second cavity in a second substrate, the second cavity having a second depth; aligning the first cavity and the second cavity with each other; affixing the first substrate to the second substrate to form a waveguide substrate having a hollow waveguide with a first dimension substantially equal to the first depth plus the second depth; forming a conductive layer on the sidewalls of the hollow waveguide; and placing the waveguide substrate over a packaged semiconductor device, the hollow waveguide aligned with a launcher of the packaged semiconductor device. The conductive layer formed on the sidewalls of the hollow waveguide may include a copper material. The method may further include placing a waveguide antenna structure over the waveguide substrate, the hollow waveguide providing a continuous channel between the launcher of the packaged semiconductor device and the waveguide antenna structure. The second cavity formed in the second substrate may be a mirrored copy of the first cavity formed in the first substrate. The method may further include forming a low modulus interface material between the waveguide substrate and the packaged semiconductor device. The first substrate and the second substrate may be each formed from multilayer printed circuit board material, each of the first substrate and the second substrate having a first conductive layer formed at a top surface and a second conductive layer formed at a bottom surface. The method may further include forming a conductive via through the first substrate and the second substrate interconnecting the first and second conductive layers of the first and second substrates. The affixing the first substrate to the second substrate may further include applying a conductive layer between the first substrate and the second substrate. The first dimension may be characterized as a height dimension and a second dimension may be characterized as a width dimension of the hollow waveguide, the hollow waveguide configured with first and second dimensions sufficient for propagation of radar signals.

In another embodiment, there is provided, an assembly including a first cavity formed in a first substrate; a second cavity formed in a second substrate, the second substrate affixed to the first substrate configured as a waveguide substrate having a hollow waveguide with a first dimension substantially equal to a first depth of the first cavity plus a second depth of the second cavity; a conductive layer formed on the sidewalls of the hollow waveguide; and a packaged semiconductor device, the waveguide substrate located over the packaged semiconductor device such that the hollow waveguide is aligned with a launcher of the packaged semiconductor device. The conductive layer formed on the sidewalls of the hollow waveguide may include a copper material. The assembly may further include a waveguide antenna structure located over the waveguide substrate, the hollow waveguide configured as a continuous channel between the launcher of the packaged semiconductor device and the waveguide antenna structure. The second substrate may be affixed to the first substrate by way of a conductive layer disposed between the first substrate and the second substrate. The first substrate and the second substrate may be each formed from multilayer printed circuit board material, each of the first substrate and the second substrate having a first conductive layer formed at a top surface and a second conductive layer formed at a bottom surface. The assembly may further include forming a conductive via through the first substrate and the second substrate interconnecting the first and second conductive layers of the first and second substrates. The first dimension may be characterized as a height dimension and a second dimension may be characterized as a width dimension of the hollow waveguide, the hollow waveguide configured with first and second dimensions sufficient for propagation of radar signals.

In yet another embodiment, there is provided, a method including forming a first cavity in a first substrate; forming a second cavity in a second substrate; aligning the first cavity and the second cavity with each other; affixing the first substrate to the second substrate to form a waveguide substrate having a hollow waveguide configured for propagation of radar signals; forming a conductive layer on the sidewalls of the hollow waveguide; and placing the waveguide substrate over a packaged semiconductor device, the hollow waveguide aligned with a launcher of the packaged semiconductor device. The conductive layer formed on the sidewalls of the hollow waveguide may include a copper material. The method may further include placing a waveguide antenna structure over the waveguide substrate, the hollow waveguide providing a continuous channel between the launcher of the packaged semiconductor device and the waveguide antenna structure. The first substrate and the second substrate may be each formed from multilayer printed circuit board material, each of the first substrate and the second substrate having a first conductive layer formed at a top surface and a second conductive layer formed at a bottom surface.

By now, it should be appreciated that there has been provided a low cost assembly including a semiconductor device with a substrate integrated waveguide. The substrate integrated waveguide includes a hollow waveguide channel formed in a waveguide substrate. The waveguide substrate is formed from a multilayer printed circuit board material. A first portion of the waveguide channel may be formed in a first waveguide substrate and a second portion of the waveguide channel may be formed in a second waveguide substrate such that the waveguide channel is formed when the first and second waveguide substrates are joined together. In this manner, a low cost waveguide can provide a channel configured for propagation of radar and mmWave signals between the semiconductor device and a waveguide antenna, for example.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
forming a first cavity in a first substrate, the first cavity having a first depth;
forming a second cavity in a second substrate, the second cavity having a second depth;
aligning the first cavity and the second cavity with each other;
affixing the first substrate to the second substrate to form a waveguide substrate having a hollow waveguide with a first dimension substantially equal to the first depth plus the second depth;
depositing a conductive layer on sidewalls of the hollow waveguide of the formed-waveguide substrate;
affixing a packaged semiconductor device on a printed circuit board (PCB); and
placing the waveguide substrate over the packaged semiconductor device, the waveguide substrate not contacting the PCB, and the hollow waveguide aligned with a launcher of the packaged semiconductor device.

2. The method of claim 1, wherein the conductive layer deposited on the sidewalls of the hollow waveguide comprises a copper material.

3. The method of claim 1, further comprising placing a waveguide antenna structure over the waveguide substrate, the hollow waveguide providing a continuous channel between the launcher of the packaged semiconductor device and the waveguide antenna structure.

4. The method of claim 1, wherein the second cavity formed in the second substrate is a mirrored image of the first cavity formed in the first substrate.

5. The method of claim 1, further comprising forming a low modulus interface material between the waveguide substrate and the packaged semiconductor device.

6. The method of claim 1, wherein the first substrate and the second substrate are each formed from multilayer printed circuit board material, each of the first substrate and the second substrate having a first conductive layer formed at a top surface and a second conductive layer formed at a bottom surface.

7. The method of claim 6, further comprising forming a conductive via through the first substrate and the second substrate interconnecting the first and second conductive layers of the first and second substrates.

8. The method of claim 1, wherein the affixing the first substrate to the second substrate further comprises applying a conductive layer between the first substrate and the second substrate.

9. The method of claim 1, wherein the first dimension is characterized as a height dimension of the hollow waveguide and a second dimension is characterized as a width dimension of the hollow waveguide, the hollow waveguide configured with the first and second dimensions sufficient for propagation of radar signals.

10. An assembly comprising:
a first cavity formed in a first substrate;
a second cavity formed in a second substrate, the second substrate affixed to the first substrate configured as a waveguide substrate having a hollow waveguide with a first dimension substantially equal to a first depth of the first cavity plus a second depth of the second cavity;
a second conductive layer deposited on a first conductive layer formed on sidewalls of the hollow waveguide of the waveguide substrate; and
a packaged semiconductor device affixed on a printed circuit board (PCB), the waveguide substrate located over the packaged semiconductor device and not contacting the PCB, and the hollow waveguide aligned with a launcher of the packaged semiconductor device.

11. The assembly of claim 10, wherein the second conductive layer deposited on the sidewalls of the hollow waveguide comprises a copper material.

12. The assembly of claim 10, further comprising a waveguide antenna structure located over the waveguide substrate, the hollow waveguide configured as a continuous channel between the launcher of the packaged semiconductor device and the waveguide antenna structure.

13. The assembly of claim 10, wherein the second substrate is affixed to the first substrate by way of a third conductive layer disposed between the first substrate and the second substrate.

14. The assembly of claim 10, wherein the first substrate and the second substrate are each formed from multilayer printed circuit board material, each of the first substrate and the second substrate having a first substrate conductive layer formed at a top surface and a second substrate conductive layer formed at a bottom surface.

15. The assembly of claim 14, further comprising forming a conductive via through the first substrate and the second substrate interconnecting the first and second substrate conductive layers of the first and second substrates.

16. The assembly of claim 10, wherein the first dimension is characterized as a height dimension of the hollow waveguide and a second dimension is characterized as a width dimension of the hollow waveguide, the hollow waveguide configured with the first and second dimensions sufficient for propagation of radar signals.

17. A method comprising:
forming a first cavity in a first substrate;
forming a second cavity in a second substrate;
aligning the first cavity and the second cavity with each other;
affixing the first substrate to the second substrate to form a waveguide substrate having a hollow waveguide configured for propagation of radar signals;
depositing a conductive layer on sidewalls of the hollow waveguide of the formed waveguide substrate;
affixing a packaged semiconductor device on a printed circuit board (PCB); and
placing the waveguide substrate over the packaged semiconductor device, the waveguide substrate not contacting the PCB, and the hollow waveguide aligned with a launcher of the packaged semiconductor device.

18. The method of claim 17, wherein the conductive layer deposited on the sidewalls of the hollow waveguide comprises a copper material.

19. The method of claim 17, further comprising placing a waveguide antenna structure over the waveguide substrate, the hollow waveguide providing a continuous channel between the launcher of the packaged semiconductor device and the waveguide antenna structure.

20. The method of claim 17, wherein the first substrate and the second substrate are each formed from multilayer printed circuit board material, each of the first substrate and the second substrate having a first conductive layer formed at a top surface and a second conductive layer formed at a bottom surface.

* * * * *